United States Patent
Jafarian-Tehrani

(10) Patent No.: US 10,690,727 B2
(45) Date of Patent: Jun. 23, 2020

(54) IDENTIFYING COMPONENTS ASSOCIATED WITH A FAULT IN A PLASMA SYSTEM

(71) Applicant: Lam Research Corporation, Fremont, CA (US)

(72) Inventor: Seyed Jafar Jafarian-Tehrani, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 160 days.

(21) Appl. No.: 15/836,041

(22) Filed: Dec. 8, 2017

(65) Prior Publication Data

US 2018/0100885 A1 Apr. 12, 2018

Related U.S. Application Data

(62) Division of application No. 14/855,191, filed on Sep. 15, 2015, now Pat. No. 9,851,389.

(60) Provisional application No. 62/066,784, filed on Oct. 21, 2014.

(51) Int. Cl.
   *G01R 31/50* (2020.01)
   *C23C 16/505* (2006.01)
   *C23C 16/455* (2006.01)
   *H01R 13/506* (2006.01)
   *H01J 37/32* (2006.01)

(52) U.S. Cl.
   CPC ........ *G01R 31/50* (2020.01); *C23C 16/45544* (2013.01); *C23C 16/505* (2013.01); *H01J 37/3299* (2013.01); *H01J 37/32174* (2013.01); *H01J 37/32926* (2013.01); *H01J 37/32935* (2013.01); *H01R 13/506* (2013.01)

(58) Field of Classification Search
   USPC ............... 324/537, 76.11–76.13, 754.24
   See application file for complete search history.

(56) References Cited

U.S. PATENT DOCUMENTS

| | | | | |
|---|---|---|---|---|
| 5,227,000 A | * | 7/1993 | Kobayashi | ........ H01L 21/67248 118/725 |
| 2007/0284246 A1 | * | 12/2007 | Keil | ....................... C23C 16/509 204/298.36 |
| 2015/0301100 A1 | * | 10/2015 | Valcore, Jr. | ....... H01J 37/32174 702/59 |

* cited by examiner

*Primary Examiner* — Vincent Q Nguyen
(74) *Attorney, Agent, or Firm* — Penilla IP, APC

(57) ABSTRACT

A method for identifying a faulty component in a plasma tool is described. The method includes accessing a measurement of a parameter received from a frequency generator and measurement device. The measurement is generated based on a plurality of radio frequency (RF) signals that are provided to a portion of a plasma tool. The RF signals have one or more ranges of frequencies. The method further includes determining whether the parameter indicates an error, which indicates a fault in the portion of the plasma tool. The method includes identifying limits of the frequencies in which the error occurs and identifying based on the limits of the frequencies in which the error occurs one or more components of the portion of the plasma tool creating the error.

13 Claims, 22 Drawing Sheets

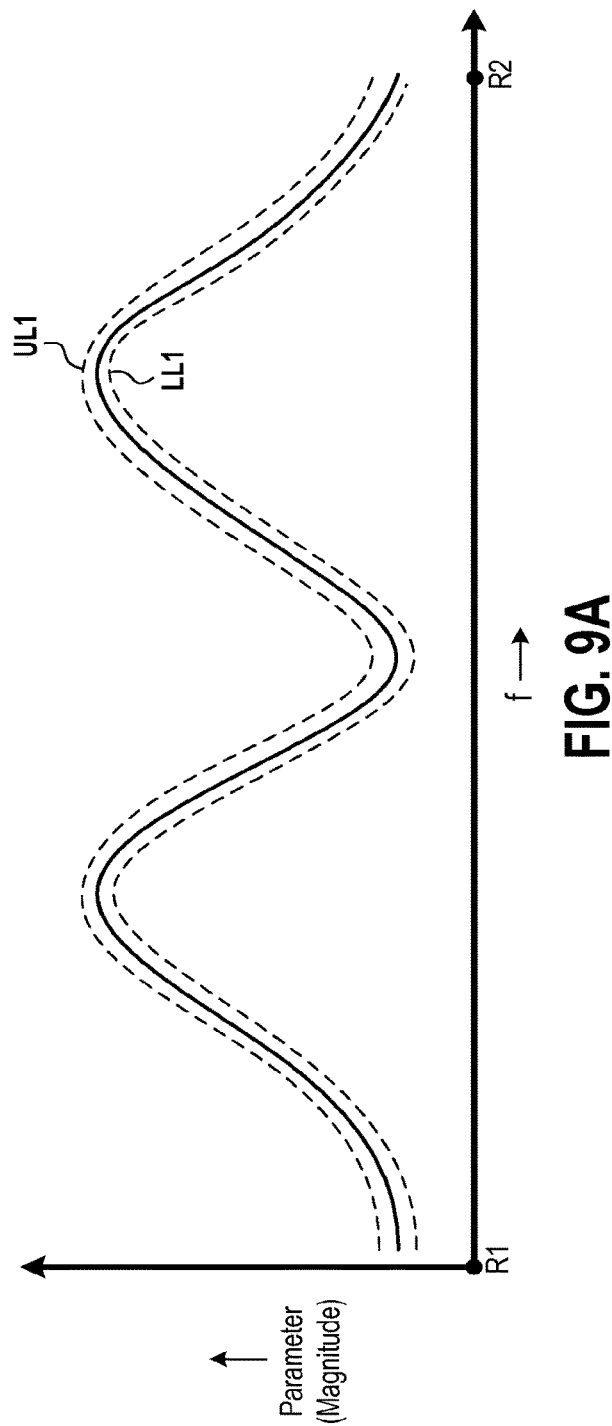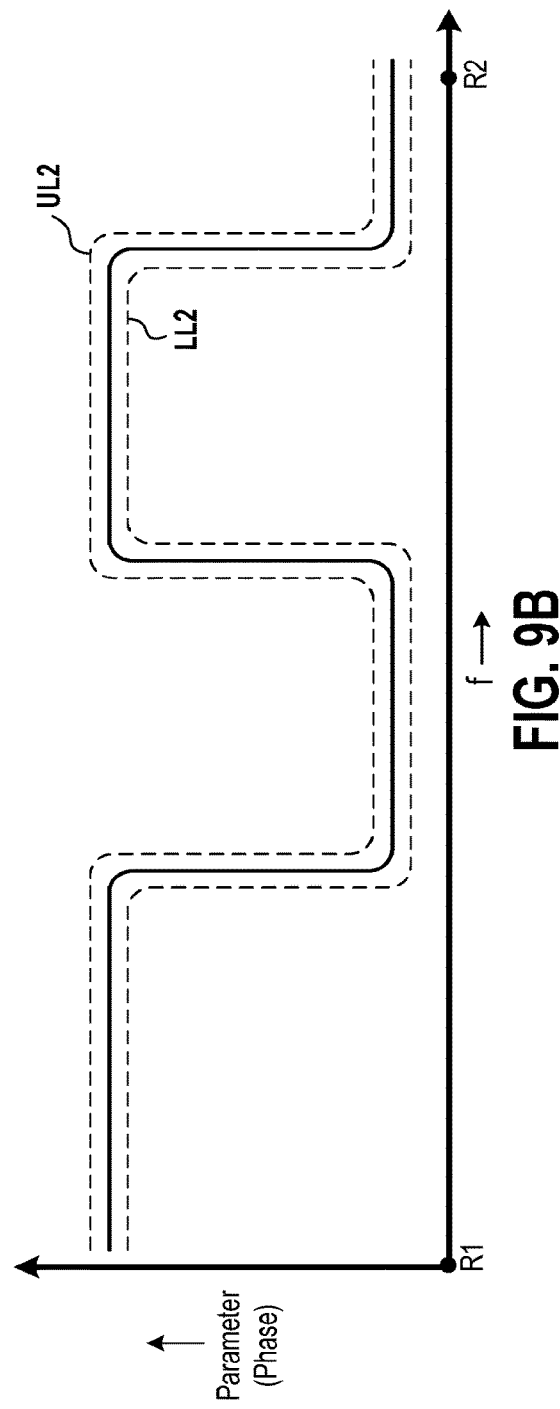

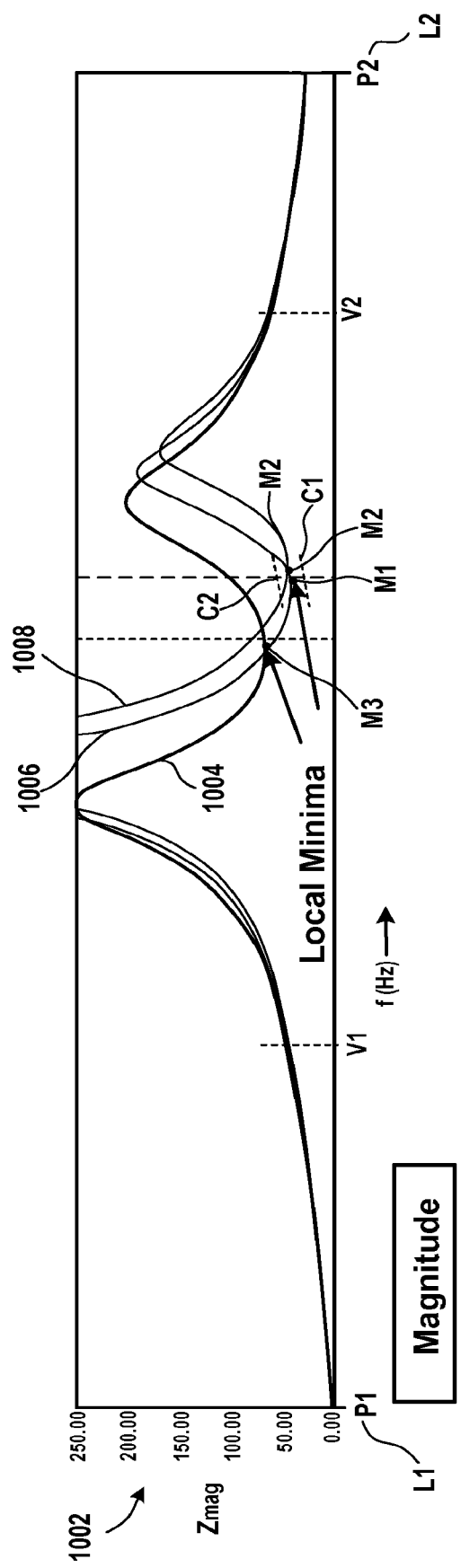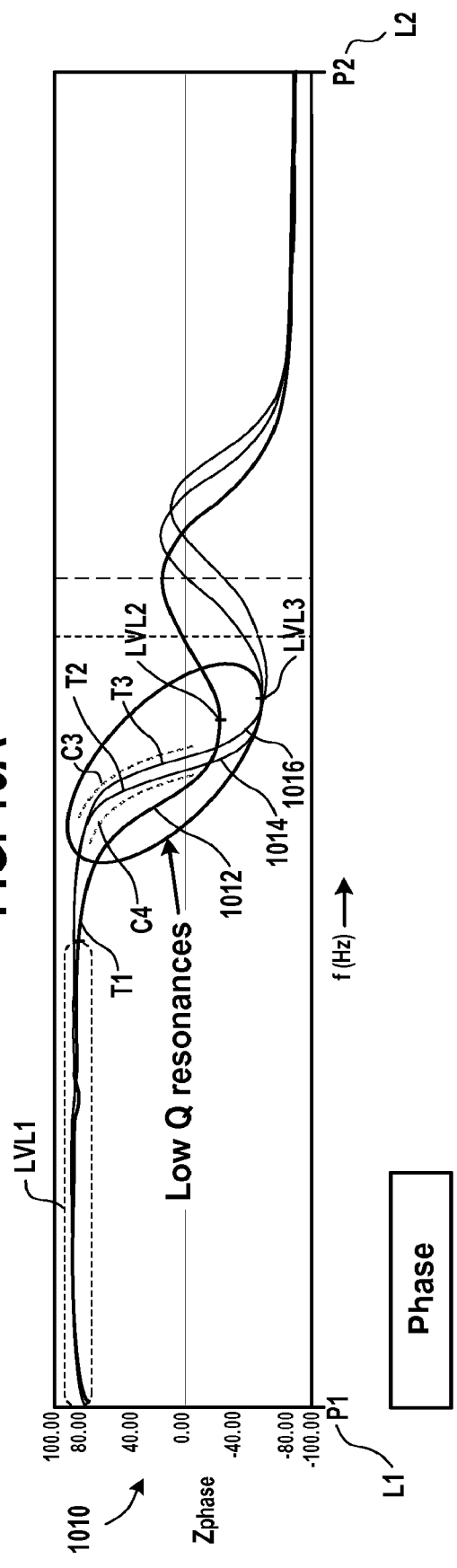

IDENTIFYING COMPONENTS ASSOCIATED WITH A FAULT IN A PLASMA SYSTEM

CLAIM OF PRIORITY

This application is a divisional of and claims the benefit of and priority, under 35 U.S.C. 120, to U.S. patent application Ser. No. 14/855,191, filed on Sep. 15, 2015, and titled "Identifying Components Associated With a Fault in a Plasma System", which claims the benefit of and priority, under 35 U.S.C. § 119(e), to U.S. Provisional Patent Application No. 62/066,784, filed on Oct. 21, 2014, and titled "Identifying Components Associated With a Fault in a Plasma System", all of which are hereby incorporated by reference in their entirety.

FIELD

The present embodiments relate to identifying components associated with a fault in a plasma tool.

BACKGROUND

A plasma chamber is used for a variety of operations. For example, the plasma chamber is used to deposit materials on a wafer, to etch the wafer, to clean the wafer, etc. To perform the operations, the plasma chamber is controlled. For example, an amount of power to be supplied to the plasma chamber is provided in a recipe to control the plasma chamber.

Moreover, the plasma chamber forms a part of a plasma system. The plasma system includes other parts, such as, for example, radio frequency (RF) generators, impedance matching network, etc. With usage of the plasma system, the parts deteriorate over time. Also, some plasma systems have faults during a first use of the plasma systems.

When a plasma system has a fault or is deteriorated, it is difficult to use the plasma chamber. It is in this context that embodiments described in the present disclosure arise.

SUMMARY

Embodiments of the disclosure provide apparatus, methods and computer programs for identifying components associated with a fault in a plasma tool. It should be appreciated that the present embodiments can be implemented in numerous ways, e.g., a process, an apparatus, a system, a device, or a method on a computer-readable medium. Several embodiments are described below.

In some embodiments, a method for identifying a faulty component in a plasma tool is described. The method includes accessing a measurement of a parameter received from a frequency generator and measurement device. The measurement is generated based on a plurality of radio frequency (RF) signals that are provided to a portion of a plasma tool. The RF signals have one or more ranges of frequencies. The method further includes determining whether the parameter indicates an error, which indicates a fault in the portion of the plasma tool. The method includes identifying limits of the frequencies in which the error occurs and identifying based on the limits of the frequencies in which the error occurs one or more components of the portion of the plasma tool creating the error. The method is executed by a processor.

In various embodiments, a method for identifying a faulty component in a plasma tool is described. The method includes generating a plurality of RF signals for providing the RF signals to a portion of a plasma tool. The RF signals have one or more ranges of frequencies. The method further includes measuring a parameter based on the one or more RF signals and providing the parameter to a host system. The host system is used for determining whether the parameter indicates an error in the portion of the plasma tool, identifying limits of the frequencies in which the error occurs, and identifying based on the limits of the frequencies in which the error occurs one or more components of the portion of the plasma tool creating the error.

In some embodiments, a plasma system is described. The plasma system includes a plasma tool. The plasma tool includes a plasma chamber, which includes a number of components. The components include multiple electrodes. One of the electrodes is for receiving a plurality of RF signals. The RF signals have one or more ranges of frequencies. The plasma tool further includes an RF transmission line connected to the plasma chamber for facilitating a transfer of the RF signals to the plasma chamber. At least a portion of the RF transmission line is connected to a frequency generator and measurement device. The plasma system includes a host system connected to the frequency generator and measurement device. The host system is used for receiving a measurement of a parameter from the frequency generator and measurement device. The measurement is generated based on the RF signals. The host system is further used for determining whether the parameter indicates an error in the plasma chamber or the RF transmission line, identifying limits of the frequencies in which the error occurs, and identifying based on the limits of the frequencies in which the error occurs one or more components of the plasma chamber or the RF transmission line creating the error.

In some embodiments, a connector is described. The connector includes a housing having an open end, which facilitates entrance within a space of the housing. The connector further includes a port attached to the housing to form a closed end of the housing. The closed end is oppositely located in comparison to the open end. The port has a pin for transferring an RF signal. The connector includes a screw having a head and a threaded portion. The head has a space for receiving an end of the pin for fitting the pin inside the space of the head. The threaded portion is used for attaching to an RF rod. The pin is used for receiving a connector of a frequency generator and measurement device.

In various embodiments, a method for identifying one or more faulty components within a plasma tool is described. The method includes providing a command to generate a plurality of RF signals. The command is provided to a frequency generator and measurement device. The RF signals are to be provided to a portion of a plasma tool. The RF signals having a range of frequencies. The method further includes receiving a measurement of a parameter from the frequency generator and measurement device. The measurement is generated based on the RF signals. The method includes determining whether the parameter indicates an error in the portion of the plasma tool and identifying a sub-range of frequencies within the range of frequencies. The sub-range is one in which the error is indicated. The method includes identifying based on the sub-range one or more components of the portion of the plasma tool creating the error. The method is executed by a processor.

Some advantages of the above-described embodiments include identifying one or more faulty components based on a range of frequencies of RF signals that are sensed by a sensor. In some embodiments, each faulty component or a group of faulty components of a plasma tool creates a signature of a magnitude or a phase of a complex parameter, e.g., impedance, power, etc. The signature is used to identify the faulty component or the group of faulty components. Moreover, additional advantages of the above-described embodiments include a connector that is fitted to a portion, e.g., an RF transmission line, etc., of a plasma tool without modifying the portion. For example, the connector includes a screw that couples to threads of the RF transmission line. The threads of the RF transmission line are present for attaching the RF transmission line to an RF strap, which couples to an impedance matching circuit. The RF strap is decoupled from the RF transmission line to access a spacing surrounded by the threads. The threads are then fitted with the screw to attach the connector to the RF transmission line. The connector connects to a complementary connector of a frequency generator and measurement device, e.g., a network analyzer, etc., to receive RF signals from the RF transmission line and measure the complex parameter.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 9A plots magnitudes of the parameter versus frequencies of RF signals having the frequency ranges 1 thru n, in accordance with some embodiments described in the present disclosure.

FIG. 9B plots phases of the parameter versus frequencies of RF signals having the frequency ranges 1 thru n, in accordance with several embodiments described in the present disclosure.

FIG. 10A is a graph that plots magnitudes of impedances of RF signals that are sensed by a sensor versus frequencies f of the RF signals, in accordance with various embodiments described in the present disclosure.

FIG. 10B is a graph that plots phases of impedances of RF signals that are sensed by the sensor versus frequencies f of the RF signals, in accordance with several embodiments described in the present disclosure.

1 and for identifying a faulty component of the plasma tool, in accordance with several embodiments described in the present disclosure.

DETAILED DESCRIPTION

The following embodiments describe systems and methods for identifying one or more faulty components in a plasma tool. It will be apparent that the present embodiments may be practiced without some or all of these specific details. In other instances, well known process operations have not been described in detail in order not to unnecessarily obscure the present embodiments.

Figure 1:
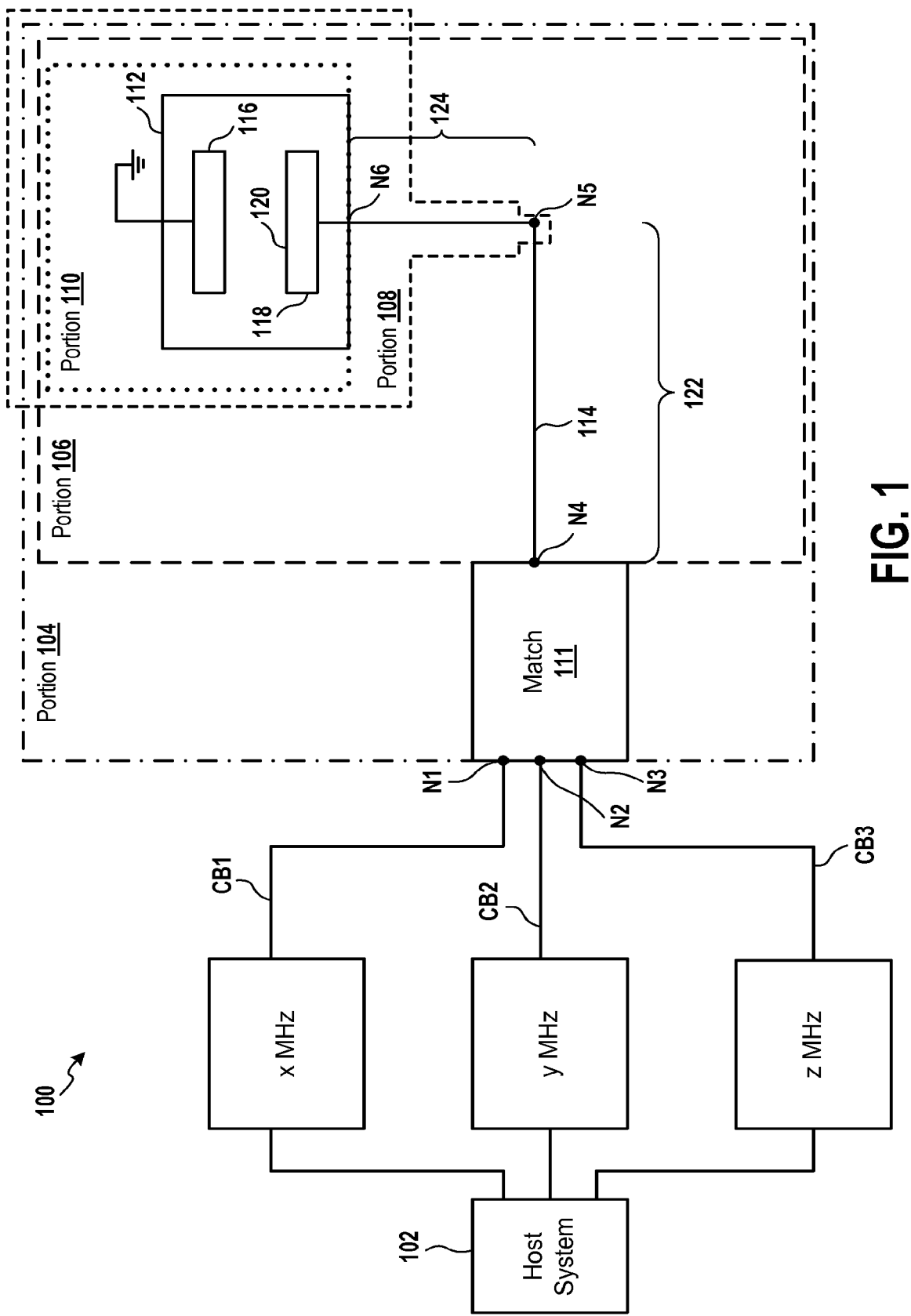
FIG. 1 is a diagram of a plasma tool for generating plasma, in accordance with some embodiments described in the present disclosure.

FIG. 1 is a diagram of an embodiment of a plasma tool 100 for generating plasma. A host system 102 is coupled to the plasma tool 100. Examples of the host system 102 include a computer, e.g., a desktop computer, a laptop computer, a tablet, a cell phone, etc.

The plasma tool 100 includes x, y, and z megahertz (MHz) radio frequency (RF) generators and a portion 104. An example of the x MHz RF generator includes a 2 MHz RF generator, an example of the y MHz RF generator includes a 27 MHz RF generator, and an example of the z MHz RF generator includes a 60 MHz RF generator.

In one embodiment, instead of the 2 MHz RF generator, a 400 kilohertz (kHz) RF generator is used.

It should be noted that in one embodiment, the operational frequencies mentioned above vary. For example, the 2 MHz RF generator operates between 1.8 MHz and 2.17 MHz. As another example, the 60 MHz RF generator operates between 57 MHz and 63 MHz, the 400 kHz RF generator operates between 360 kHz and 440 kHz, and the 27 MHz RF generator operates between 25.764 MHz and 28.476 MHz. The portion 104 includes a portion 106, which further includes a portion 108, which further includes the portion 110. The portion 104 includes an impedance matching circuit 111, a plasma chamber 112, and an RF transmission line 114 that connects the plasma chamber 112 to the impedance matching circuit 111.

The impedance matching circuit 111 includes multiple electrical circuit elements, e.g., resistors, capacitors, inductors, etc. The impedance matching circuit 111 matches an impedance at an output of the impedance matching circuit 111 with an impedance at input of the impedance matching circuit 111. For example, the impedance matching circuit 111 matches an impedance of a load with an impedance of a source. Examples of the load include the RF transmission line 114 and the plasma chamber 112. Examples of the source includes an RF cable CB1 that connects the x MHz RF generator to an input N1 of the impedance matching circuit 111, another RF cable CB2 that connects the y MHz RF generator to an input N2 of the impedance matching circuit 111, yet another RF cable CB3 that connects the z MHz RF generator to an input N3 of the impedance matching circuit 111, the x MHz RF generator, the y MHz RF generator, and the z MHz RF generator.

The plasma chamber 112 includes a chuck 118, an upper electrode 116, and may include other components (not shown in FIG. 1), e.g., an upper dielectric ring surrounding the upper electrode 116, an upper electrode extension surrounding the upper dielectric ring, a lower dielectric ring surrounding a lower electrode of the chuck 118, a lower electrode extension surrounding the lower dielectric ring, etc. The chuck 118 is an electrostatic or a magnetic chuck. The upper electrode 116 is located opposite to and facing the chuck 118 and is connected to a reference voltage, e.g., grounded, etc. The upper electrode 116 includes one or more gas inlets, e.g., holes, etc., that are coupled to a central gas feed (not shown). The central gas feed receives one or more process gases from a gas reservoir (not shown). An example of a process gas includes an oxygen-containing gas, such as $O_2$. Other examples of the process gas include a fluorine-containing gas, e.g., tetrafluoromethane ($CF_4$), sulfur hexafluoride ($SF_6$), hexafluoroethane ($C_2F_6$), etc. Each of the lower electrode and the upper electrode 116 is made of a metal, e.g., aluminum, alloy of aluminum, copper, etc.

The RF transmission line 114 includes a transmission line portion 122 and a cylinder portion 124. An input N4 of the transmission line portion 122 is connected to an output of the impedance matching circuit 111. The cylinder portion 124 is connected to the transmission line portion 122 via an RF strap, which connects an output of the transmission line portion 122 with an input N5 of the cylinder portion 124. The cylinder portion 124 is connected the plasma chamber 112 at an input N6 of the plasma chamber 112. The cylinder 124 is connected further from the input N6 to the lower electrode.

The portion 106 includes the RF transmission line 114 and the plasma chamber 112. The portion 108 includes the plasma chamber 112 and the cylinder portion 124. The portion 110 includes the plasma chamber 112.

Each portion 104, 106, 108, and 110 is tested for a fault in a component, e.g., a displaced component, a component that is made of an unsuitable material, a component that is made of a material that is of a lower grade than a quality grade, a component that is degraded or worn out over time, a short-circuited component, an open-circuited component, a component that is not grounded when a recipe indicates that the component be grounded, a component that is grounded when a recipe indicates that the component not be grounded, a component that is cracked or damaged or etc.

In operation, a wafer (not shown), e.g., a dummy wafer, a semiconductor wafer, etc., is supported on an upper surface 120 of the chuck 118. The host system 102 provides a recipe, e.g., an RF frequency of operation, magnitude and phase of supplied power, a clock signal, etc., to one or more of the x, y, and z MHz RF generators. In some embodiments, the clock signal is provided to the x MHz RF generator and not to the y and z MHz RF generators. Upon receiving the recipe, the x, y, and z MHz RF generators operate at their respective frequencies of operation, e.g. 2 MHz, 27 MHz, 60 MHz, etc., provided in the recipe to generate RF signals having respective power levels provided in the recipe. Each RF signal has a magnitude and a phase. In one embodiment, each RF signal has a real portion of impedance and an imaginary portion of the impedance. In an embodiment, each RF signal has a magnitude of gamma and a phase of gamma.

The RF signals generated by the x, y, and z MHz RF generators are provided to the impedance matching circuit 111 via the RF cables CB1 thru CB3 that connect the generators to the impedance matching circuit 111. For example, an RF signal is provided via the RF cable CB1 and the input N1 to the impedance matching circuit 111, another RF signal is provided via the RF cable CB2 and the input N2 to the impedance matching circuit 111, and another RF signal is provided via the RF cable CB3 and the input N3 to the impedance matching circuit 111.

The impedance matching circuit 111 matches an impedance of the load with that of the source to combine the RF signals received via the inputs N1 thru N3 to further generate an impedance-matched RF signal. The impedance-matched RF signal is transferred via the transmission line portion 122, the RF strap that connects the transmission line portion 122 to the cylinder portion 124, and the cylinder 124 to the lower electrode of the plasma chamber 112.

When the process gas is supplied between the upper electrode 116 and the chuck 118 and when the impedance-matched RF signal is provided to the chuck 118, plasma is generated within the plasma chamber 112 or impedance of the plasma changes. The plasma is used to perform various processes, e.g., chemical vapor deposition, embedding vias, cleaning, deposition, sputtering, etching, ion implantation, resist stripping, etc., on the wafer during production. Integrated circuits, e.g., an application specific integrated circuit (ASIC), a programmable logic device (PLD), etc. are developed on the processed wafer and the integrated circuits are used in a variety of electronic items, e.g., cell phones, tablets, smart phones, computers, laptops, networking equipment, etc.

To identify one or more components, e.g., the impedance matching circuit 111, the transmission line portion 122, the cylinder portion 124, the upper electrode 116, the chuck 118, a C-shroud (not shown in FIG. 1) of the plasma chamber 112, a spacer (not shown in FIG. 1) within the transmission line portion 122, etc., that are faulty, a test is performed on the portion 104, 106, 108, or 110 of the plasma tool 100.

To test the portion 104, the inputs N1, N2, and N3 of the impedance matching circuit 111 are disconnected from the RF cables CB1, CB2, and CB3, and a frequency generator and measurement device (FGMD) is connected to the input N1, N2, or N3. The FGMD is further described below. Moreover, to test the portion 106, the RF transmission line 114 is disconnected at its input N4 from the output of the impedance matching circuit 111 and the FGMD is connected to the input N4. Furthermore, to test the portion 108, the RF strap that connects the transmission line portion 122 to the cylinder portion 124 is removed, and the FGMD is connected to the input N5 of the cylinder portion 124.

In some embodiments, the RF strap is disconnected from the transmission line portion 122 but not from the input N5 of the cylinder portion 124 and the FGMD is connected to the RF strap to test the portion 108.

Also, to test the portion 110, the RF transmission line 114 is disconnected from the input N6 of the plasma chamber 112 and the FGMD is connected to the input N6 of the plasma chamber 112.

Figure 2:
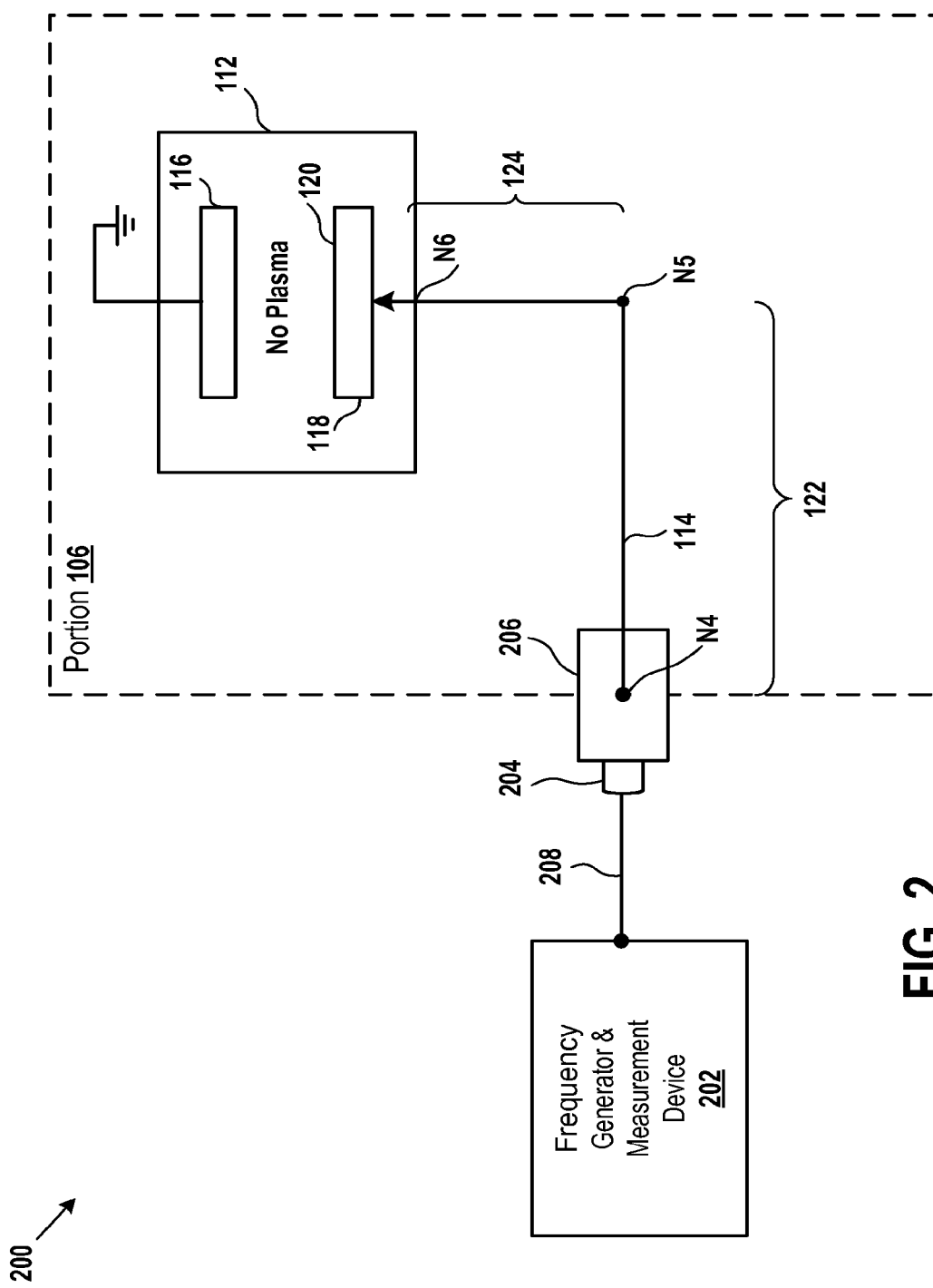
FIG. 2 is a diagram of a system for testing a radio frequency (RF) transmission line and a plasma chamber of the plasma tool of FIG. 1, in accordance with various embodiments described in the present disclosure.

FIG. 2 is a diagram of an embodiment of a system 200 for testing the RF transmission line 114 and the plasma chamber 112. The system 200 includes an FGMD 202, the RF transmission line 114, and the plasma chamber 112. Examples of the FGMD 202 includes a network analyzer, a voltage and current probe, a voltage sensor, a current sensor, a power sensor, a capacitance sensor, an inductance sensor, an impedance sensor, an ohm meter, etc. The network analyzer measures scattering parameters (S-parameters), the voltage and current probe measures a complex current and voltage, the voltage sensor measures a complex voltage, the current sensor measures a complex current, the power sensor measures complex power, the capacitance sensor measure a capacitance, the inductance sensor measures inductance, the impedance sensor measures a complex impedance, and the ohm meter measures resistance. Examples of the S-parameters include S11 and S12 parameters. Other examples of the S-parameters include S11, S12, S21, and S22 parameters. In some embodiments, the complex voltage and current includes a current magnitude, a voltage magnitude, and a phase between the current magnitude and the voltage magnitude.

In various embodiments, the S-parameters describe an electrical behavior of components of the plasma tool 100 when the components are applied RF signals to reveal a steady state of the components. The S-parameters are determined without applying open and short circuits to the plasma tool 100 and instead a matched load, e.g., the portion 104 (FIG. 1), portion 106 (FIG. 1), portion 108 (FIG. 1), or portion 110 (FIG. 1), etc., is used to determine the S-parameters. For example, the matched load is used when an impedance of the FGMD matches an impedance of the portion 104 that is connected to the FGMD. As another example, the matched load is used when an impedance of the FGMD matches an impedance of the portion 106 that is connected to the FGMD. The S-parameters are used to represent a variety of electrical properties, e.g., gain, return loss, voltage standing wave ratio (VSWR), reflection coefficient, etc., of components of the plasma tool 100. The S-parameters change with a change in a frequency of an RF signal.

The FGMD 202 is connected to the transmission line portion 122 of the RF transmission line 114 via connectors 204 and 206. For example, the connector 206 facilitates a coupling of the connector 204 to the input N4 of the transmission line portion 122. The connector 204 is coupled to the FGMD 202 via an RF cable 208. The connector 204 couples to a pin, which is further described below, of the connector 206.

The FGMD 202 generates RF signals of various frequencies and supplies the RF signals via the RF cable 208, the connectors 204 and 206, and the RF transmission line 114 to the lower electrode of the plasma chamber 112. The process gas is not supplied to the plasma chamber 112. It should be noted that during a test of a component of a plasma tool, e.g., the plasma tool 100 (FIG. 1), etc., plasma is not generated within the plasma chamber 112.

When plasma is not generated in the plasma chamber 112, the FGMD 202 measures a parameter, e.g., S11 parameter, complex impedance, complex voltage, complex current, complex voltage and current, complex delivered power, complex supplied power, capacitance, inductance, resistance, etc., of the portion 106. The parameter is used to determine whether there is a faulty component in the portion 106.

Figure 3A:
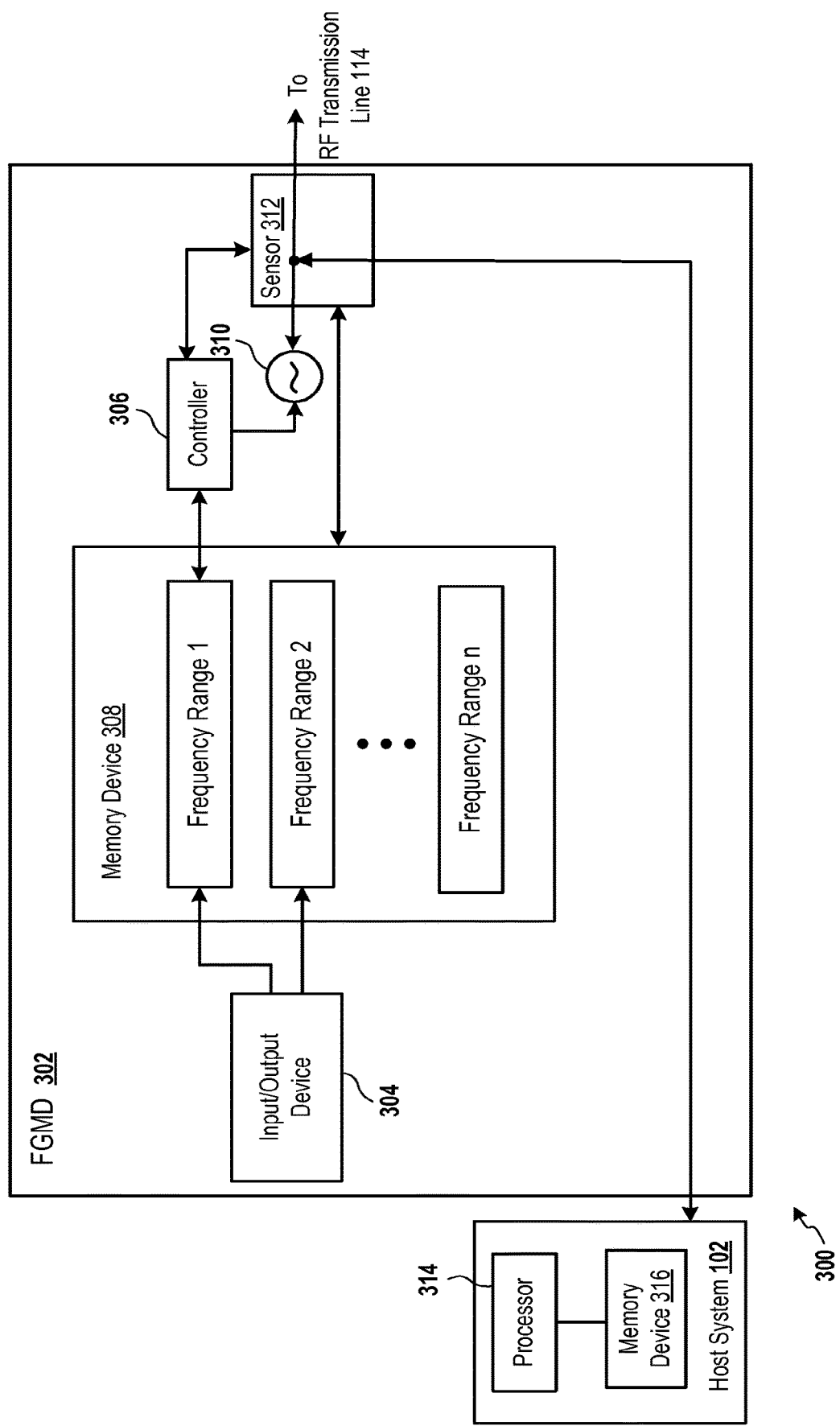
FIG. 3A is a diagram of a system to illustrate use of different frequency ranges 1 thru n to test the RF transmission line or the plasma chamber, in accordance with various embodiments described in the present disclosure.

FIG. 3A is a diagram of an embodiment of a system 300 to illustrate use of different frequency ranges 1 thru n to test the RF transmission line 114 or the plasma chamber 112 (FIG. 2), where n is an integer greater than zero. In some embodiments, the frequency range 1 includes frequencies that are exclusive of frequencies within any of the remaining frequency ranges 2 thru n. For example, the frequency range 1 includes frequencies that are excluded from frequencies of any of the frequency ranges 2 thru n. As another example, the frequency range 2 includes frequencies that are excluded from frequencies of the frequency range 1 and of any of the frequency ranges 3 thru n.

The system 300 includes an FGMD 302 and the host system 102. The FGMD 302 is an example of the FGMD 202 (FIG. 2). The frequency generator 302 includes an input/output (I/O) device 304. Examples of the I/O device 304 include keys, buttons, display screen, knobs, switches, keyboards, etc.

The frequency ranges 1 thru n are received by a controller 306 of the FGMD 302 from a user via the I/O device 304 and stored in a memory device 308. The controller 306 accesses the frequency range 1 from the memory device 308. Examples of a controller include a processor, an application specific integrated circuit (ASIC), a programmable logic device (PLD), a central processing unit (CPU), etc. Moreover, the controller 306 accesses from the memory device 308 power levels for each frequency within the frequency range 1. For example, the memory device 308 stores a mapping between a frequency of a frequency range and a peak-to-peak power. In some embodiments, the power levels for the frequencies are received from the user via the I/O device 304.

The controller 306 provides the frequency range 1 and the power levels mapped to the frequencies of the frequency range 1 to an RF power supply 310. The RF power supply 310 generates multiple RF signals having frequencies within the frequency range 1 and having the power levels that are mapped to the frequencies. The multiple RF signals are provided via the connectors 204 and 206 and the RF transmission line 114 to the lower electrode of the plasma chamber 112 (FIG. 2).

The FGMD 302 includes a sensor 312 that detects the parameter on the RF transmission line 114. The parameter is then sent from the sensor 312 to a communication port (not shown) of the host system 102. In some embodiments, the communication port of the host device 314 is a serial port, or a parallel port, or a universal serial bus (USB) port. The parameter is received by a processor 314 of the host system 102 via the communication port of the host system 102 and stored by the processor 314 in a memory device 316 of the host system 102. Examples of the memory device 316 include a hard disk, a compact disc, a flash memory, a redundant array of storage disks, etc. Other examples of a memory device include a read-only memory (ROM), a random access memory (RAM), etc. In some embodiments, a memory device is a volatile or a non-volatile memory device.

The processor 314 accesses the parameter from the memory device 316 to execute methods, which are described below with reference to FIGS. 6A, 6B, 7A, and 7B.

As used herein, a processor refers to a microprocessor, an ASIC, a PLD, or a CPU, etc.

It should be noted that although one controller and one memory device is shown in the FGMD 302, in some embodiments, the FGMD 302 includes any number of memory devices and any number of controllers. For example, the frequency ranges 1 thru n are stored in the memory device 308 and the power levels are stored in another memory device.

It should further be noted that although one processor and one memory device are shown in the host system 102, in some embodiments, the host system 102 includes any number of memory devices and any number of processors. The processors are used to execute the methods described below with reference to FIGS. 6A, 6B, 7A, and 7B.

Figure 3B:
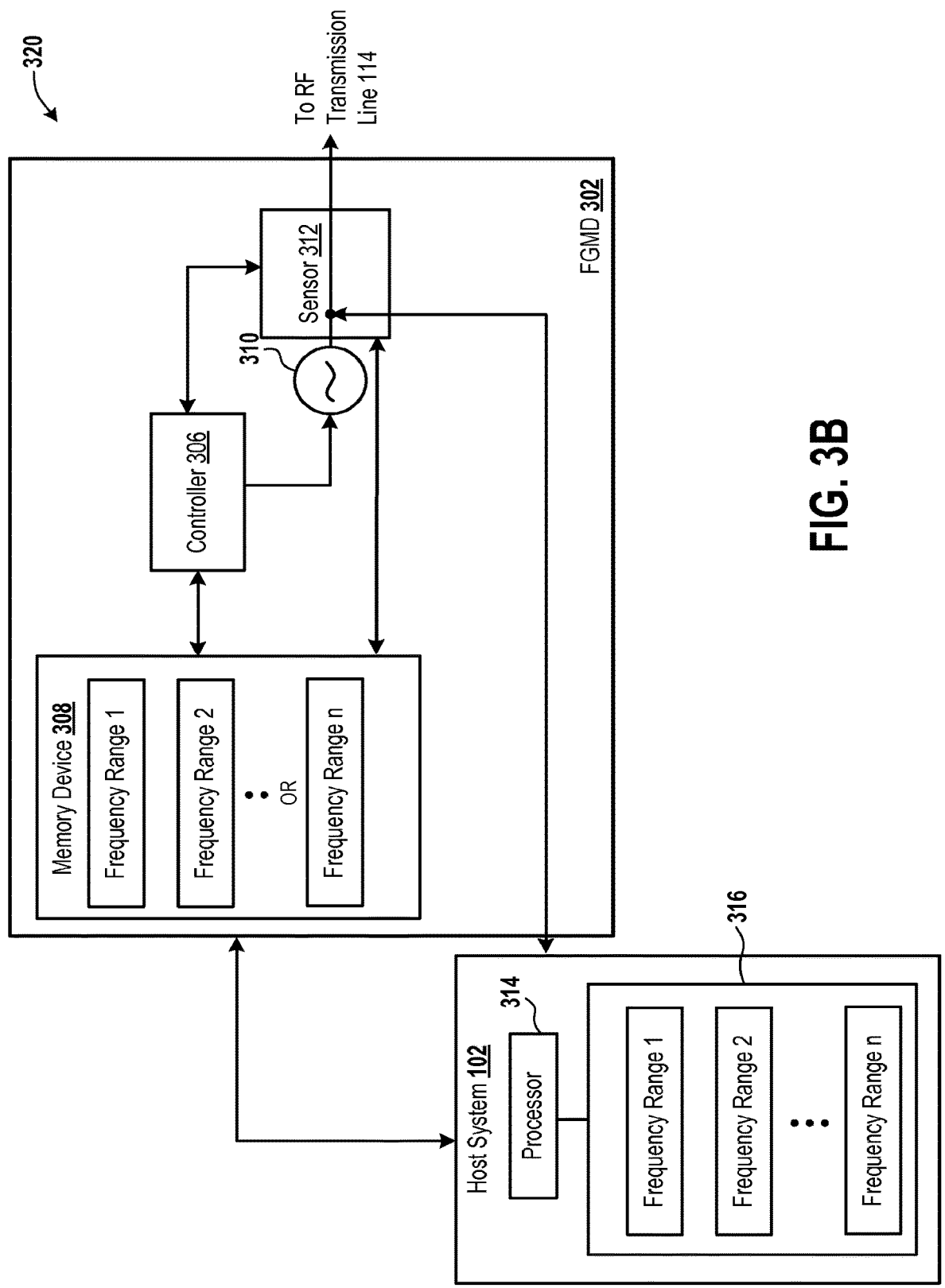
FIG. 3B is a diagram of a system for programming a frequency generator and measurement device (FGMD) with the frequency ranges 1 thru n by using a host system, in accordance with some embodiments described in the present disclosure.

FIG. 3B is a diagram of an embodiment of a system 320 for programming the FGMD 302 with the frequency ranges 1 thru n by using the host system 102. The processor 314 accesses the frequency ranges 1 thru n from the memory device 316 and provides the frequency ranges 1 thru n to the memory device 308 of the FGMD 302.

In some embodiments, the power levels for each frequency within the frequency range 1 are stored in the memory device 316 and then accessed by the processor 314 for providing to the memory device 308.

The remaining operation of the system 320 is similar, e.g., same as, etc., to the operation of the system 300 of FIG. 3A.

Figure 4:
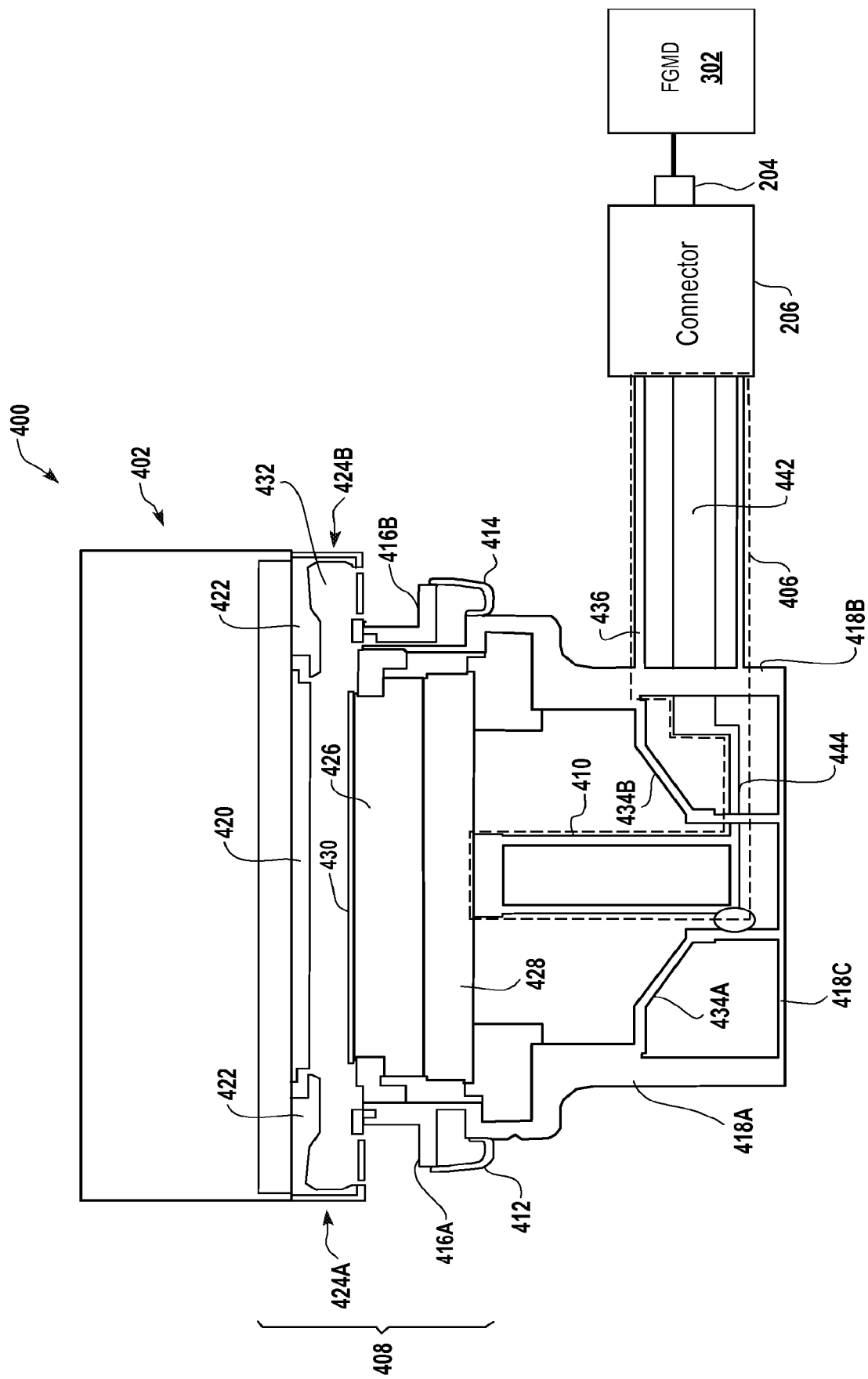
FIG. 4 is a diagram of a system for illustrating various components of the plasma tool and to illustrate connection of the FGMD with the plasma tool, in accordance with various embodiments described in the present disclosure.

FIG. 4 is a diagram of an embodiment of a system 400 for illustrating various components of a plasma tool, which is an example of the plasma tool 100 (FIG. 1), etc., and to illustrate connection of the FGMD 302 with the plasma tool. The system 400 includes a plasma reactor 402. The system 400 includes the connectors 204 and 206, an RF transmission line 406, and the FGMD 302. The RF transmission line 406 is an example of the RF transmission line 114 (FIG. 2).

The plasma reactor 402 includes a plasma chamber 408 and an RF cylinder 410, which is an example of the cylinder portion 122 (FIG. 1). The plasma reactor 402 further includes return RF straps 412 and 414, a ground ring 416 and a bottom electrode housing 418. The plasma chamber 408 includes an upper electrode 420, an upper electrode extension 422, a C-shroud 424, the ground ring 416, and a chuck assembly. The chuck assembly includes a chuck 426 and a facility plate 428. A substrate 430, e.g., a wafer, etc., is placed on top of the chuck 426 for processing the substrate 430. Examples of processing the substrate 430 include cleaning the substrate 430, or etching the substrate 430, or etching an oxide or metal on top of the substrate 430, or depositing materials, e.g., oxides, dioxides, photo resist materials, etc., on the substrate 430, or a combination thereof. The upper electrode 420 is an example of the upper electrode 116 (FIG. 1) and the chuck 426 is an example of the chuck 118 (FIG. 1).

The C-shroud 424 includes slots that are used to control pressure within the plasma chamber 408. For example, the slots are opened to increase gas flow through the slots to decrease gas pressure in a gap 432 of the plasma chamber 408. The slots are closed to decrease the gas flow to increase gas pressure in the gap 432. The gap 432 is formed between the upper electrode 420 and a lower electrode of the chuck 426.

In various embodiments, the bottom electrode housing 418 is of any shape, e.g., cylindrical, square, polygonal, etc.

In various embodiments, the RF cylinder 410 is not a cylinder and has a polygonal shape, e.g., a rectangular shape, a square shape, etc.

The upper electrode extension 422 surrounds the upper electrode 420. The C-shroud 424 includes portions 424A and 424B. The ground ring 416 includes a ground ring portion 416A and another ground ring portion 416B. The bottom electrode housing 418 includes a bottom electrode housing portion 418A, another bottom electrode housing portion 418B, and yet another bottom electrode housing portion 418C. Each bottom electrode housing portion 418A and 418B forms a side wall of the bottom electrode housing 418. The bottom electrode housing 418C forms a bottom wall of the bottom electrode housing 418. The plasma reactor 402 includes a ground shield 434, which further includes a ground shield portion 434A and another ground shield portion 434B.

The plasma chamber 408 is surrounded by the upper electrode 420 and the upper electrode extension 422. The plasma chamber 408 is further surrounded by the C-shroud 424, and the chuck 426.

The ground ring 416 is located below the C-shroud 424. In some embodiments, the ground ring 416 is located below and adjacent to the C-shroud 424. The return RF strap 412 is connected to the ground ring portion 416A and the return RF strap 414 is connected to the ground ring portion 416B. The return RF strap 412 is connected to the bottom electrode housing portion 418A and the return RF strap 414 is connected to the bottom electrode housing portion 418B. The bottom electrode housing portion 418A is connected to the ground shield portion 434A and the bottom electrode housing portion 418B is connected to the ground shield portion 434B. The ground shield portion 434A is connected via the bottom electrode housing portion 418A to a grounded RF tunnel 436, e.g., an RF sheath, etc., and the ground shield portion 434B is connected via the bottom electrode housing portions 418B and 418C to the grounded RF tunnel 436.

In some embodiments, the bottom electrode housing 418 is a cylinder that surrounds the RF cylinder 410. The RF cylinder 410 is a medium for passage of an RF signal. The RF cylinder 410 is connected to an RF rod 442 via the RF coupling 444, which includes one or more RF straps, one or more RF rods, or a combination of one or more RF straps and one or more RF rods.

The connector 206 is coupled to the RF rod 442 and the RF tunnel 436. The connector 204 of the FGMD 302 is connected to the connector 206 for measuring the parameter of an RF signal. The RF signal is generated by the FGMD 302 and sent via the connector 204 of the FGMD, the connector 206, the RF rod 442, the RF coupling 444, and the RF cylinder 410 to the chuck 426. When the RF signal is transferred, impedance of the RF signal changes and the FGMD 302 measures the parameter generated based on the RF signal having the changed impedance.

It should be noted that the plasma reactor 402, the RF transmission line 406, the plasma chamber 408, the RF cylinder 410, the return RF straps 412 and 414, the ground ring 416, the bottom electrode housing 418, the upper electrode 420, the upper electrode extension 422, the C-shroud 424, the chuck 426, the facility plate 428, the ground shield 434, the RF rod 442, spacers (not shown in FIG. 4), and the RF coupling 444 are examples of components of a plasma tool.

Figure 5A:
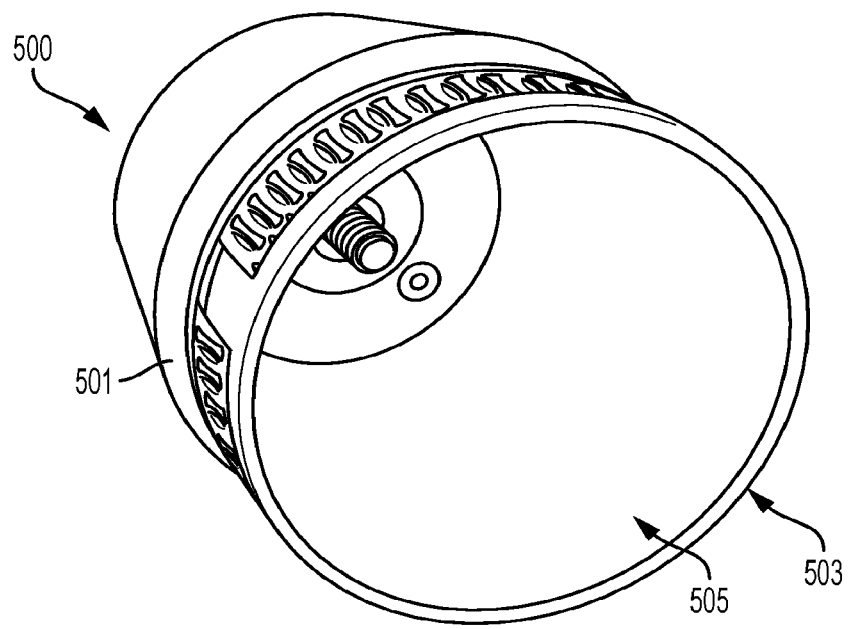
FIG. 5A is a perspective view of a connector for facilitating coupling of a connector of the FGMD with the RF transmission line, in accordance with several embodiments described in the present disclosure.

FIG. 5A is a perspective view of an embodiment of a connector 500 for facilitating coupling of a connector, e.g., the connector 204, etc., of the FGMD 202 (FIG. 2) with the RF transmission line 114 (FIG. 1). The connector 500 is an example of the connector 206 (FIG. 2). The connector 500 includes a housing 501. The housing 501 is made of a metal, e.g., aluminum, copper, steel, an alloy of steel and aluminum, etc. The housing 501 has an open end 503, which allows entry into a space 505 within the housing 501.

In some embodiments, instead of a circular cross-section as shown in FIG. 5A, the housing 501 has a cross-section of another shape, e.g., square, rectangular, polygonal, elliptical, a shape formed by a combination of straight lines and curves, etc.

Figure 5B:
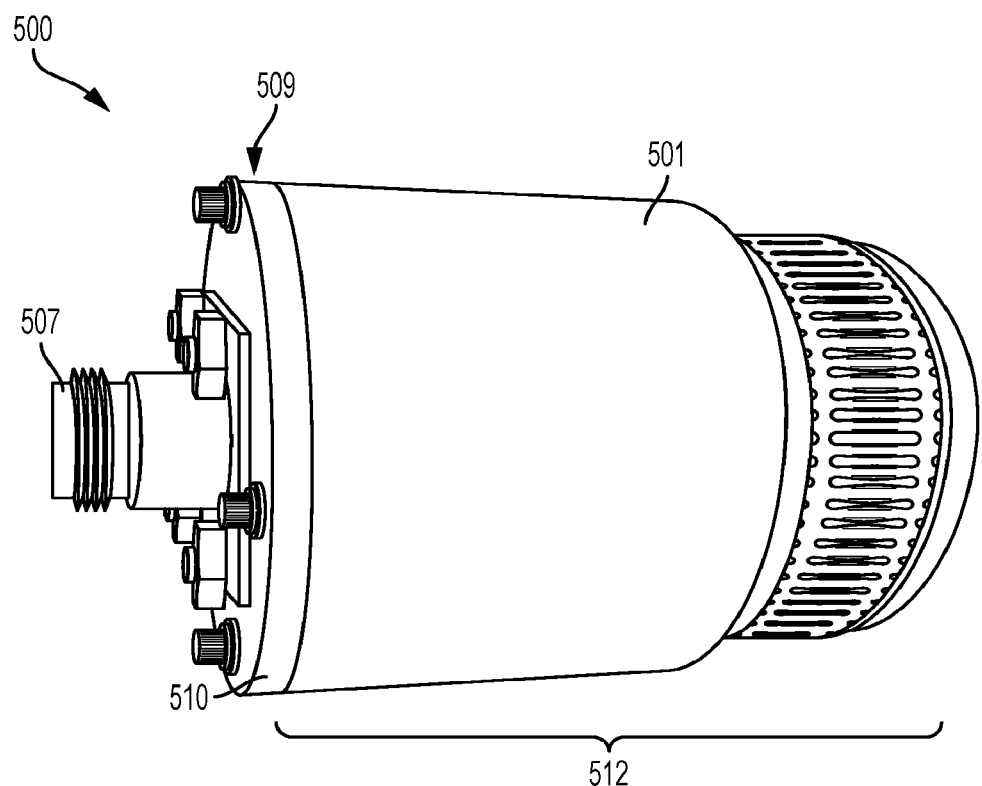
FIG. 5B is another perspective view of the connector of FIG. 5A having a port, in accordance with some embodiments described in the present disclosure.

FIG. 5B is another perspective view of an embodiment of the connector 500 having a port 507. The connector 500 has a closed end 509, which is located opposite to the open end 503 (FIG. 5A). The closed end 509 is formed by the port 507 and a cap 510, which is fitted via one or more attachment mechanisms to a portion 512 of the housing 500. Examples of an attachment mechanism include a screw, a screw and a bolt, a solder, etc. In some embodiments, the portion 512 and the cap 510 are integrated into one part to form the housing 501.

The port 507 is also fitted to the cap 510 via one or more attachment mechanisms. The port 507 is connected to the RF rod 442 (FIG. 4) at one end of the port 507 and is connected to a connector, e.g., the connector 204 (FIG. 2), etc., of the FGMD 202 at an opposite end of the port 507.

Figure 5C:
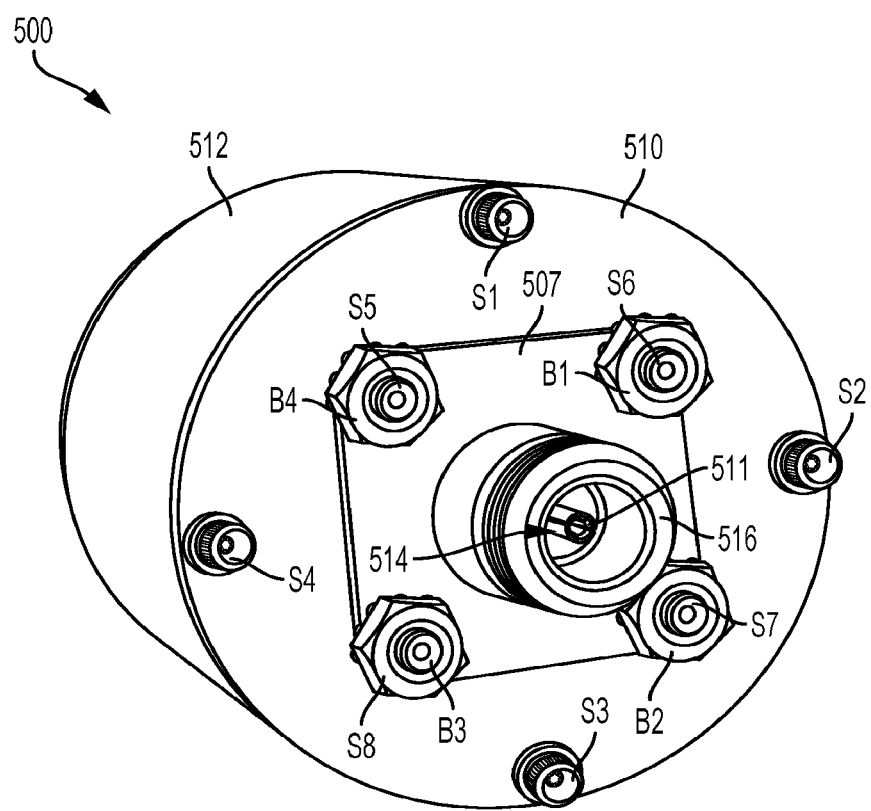
FIG. 5C is a perspective view of the connector of FIG. 5A, in accordance with some embodiments described in the present disclosure.

FIG. 5C is a perspective view of an embodiment of the connector 500. As shown, the portion 512 is attached to the cap 510 via screws S1, S2, S3, and S4. In some embodiments, the portion 512 is attached to the cap 510 via any number of screws or attachment mechanisms.

Moreover, as shown, the port 507 is attached to the cap 510 via screws S5, S6, S7, and S8, and bolts B1, B2, B3, and B4. Similarly, the port 507 is detached from the cap 510 by removing the screws S5, S6, S7, and S8 and the bolts B1, B2, B3, and B4. In some embodiments, the port 507 is attached to the cap 510 via any number of screws, bolts, or attachment mechanisms.

The port 507 includes a pin 511 that extends through the cap 510. An end 514 of the pin 511 connects to a female receptacle of a connector, e.g., the connector 204 (FIG. 2), etc., of the FGMD 202. The pin 511 extends through the closed end 509 (FIG. 5B) into the space 505 (FIG. 5A) formed within the housing 501. A housing of a connector of the FGMD 202 extends around a housing 516 of the port 507 to facilitate a connection between the end 514 of the pin 511 and the female receptacle of the connector of the FGMD 202.

Figure 5D:
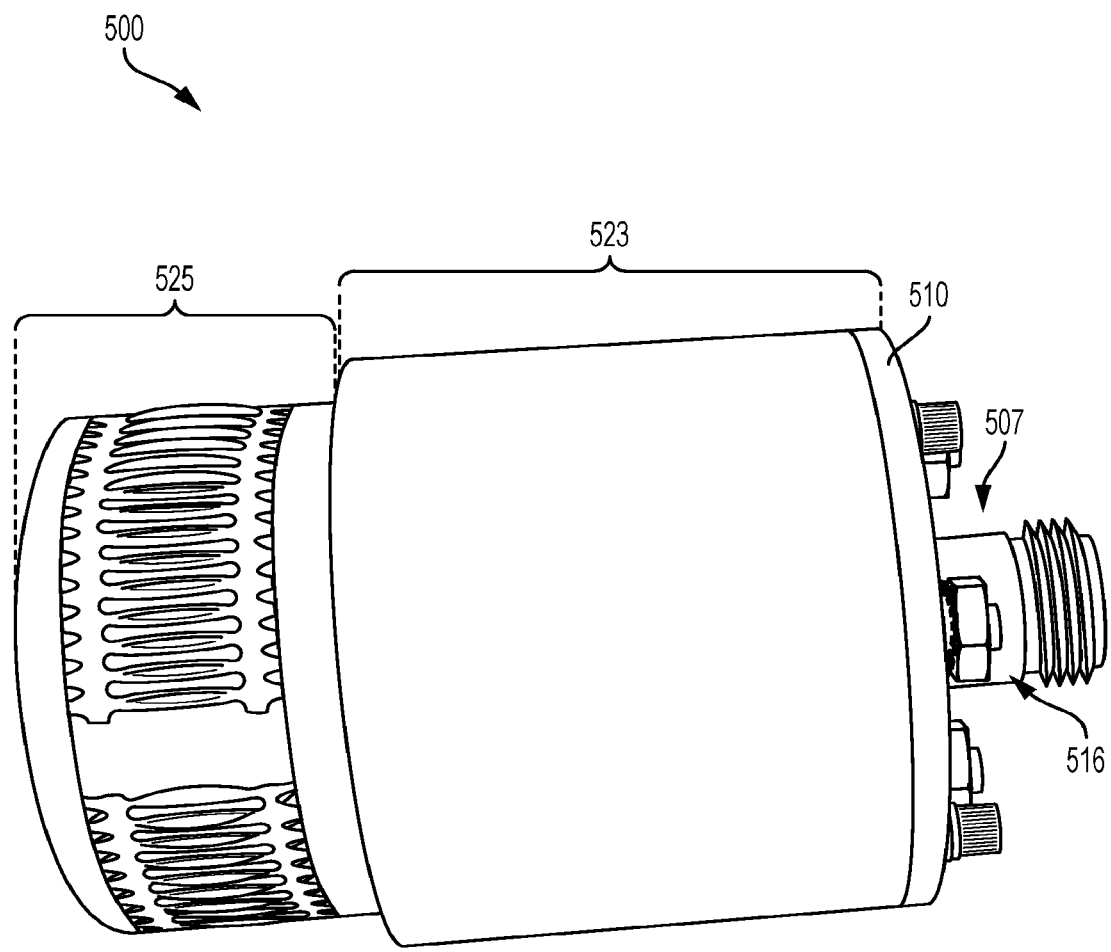
FIG. 5D is a side view of the connector of FIG. 5A, in accordance with various embodiments described in the present disclosure.

FIG. 5D is a side view of an embodiment of the connector 500. The connector 500 includes a first portion 523 of the housing 501 and a second portion 525 of the housing 501. The first portion 523 has a greater cross-sectional diameter than a cross-sectional diameter of the second portion 525. The first portion 523 includes the cap 510.

In various embodiments, the first portion 523 has multiple cross-sectional diameters and all of the cross-sectional diameters are greater than multiple cross-sectional diameters of the second portion 525.

In some embodiments, the first portion 523 has the same cross-sectional diameter or a lesser cross-sectional diameter compared to that of the second portion 525. It should be noted that in some embodiments, a surface of the first portion 523 is smooth or textured, e.g., ribbed, rippled, rough, etc. Moreover, in various embodiments, a surface of the second portion 525 is smooth or textured.

Figure 5E:
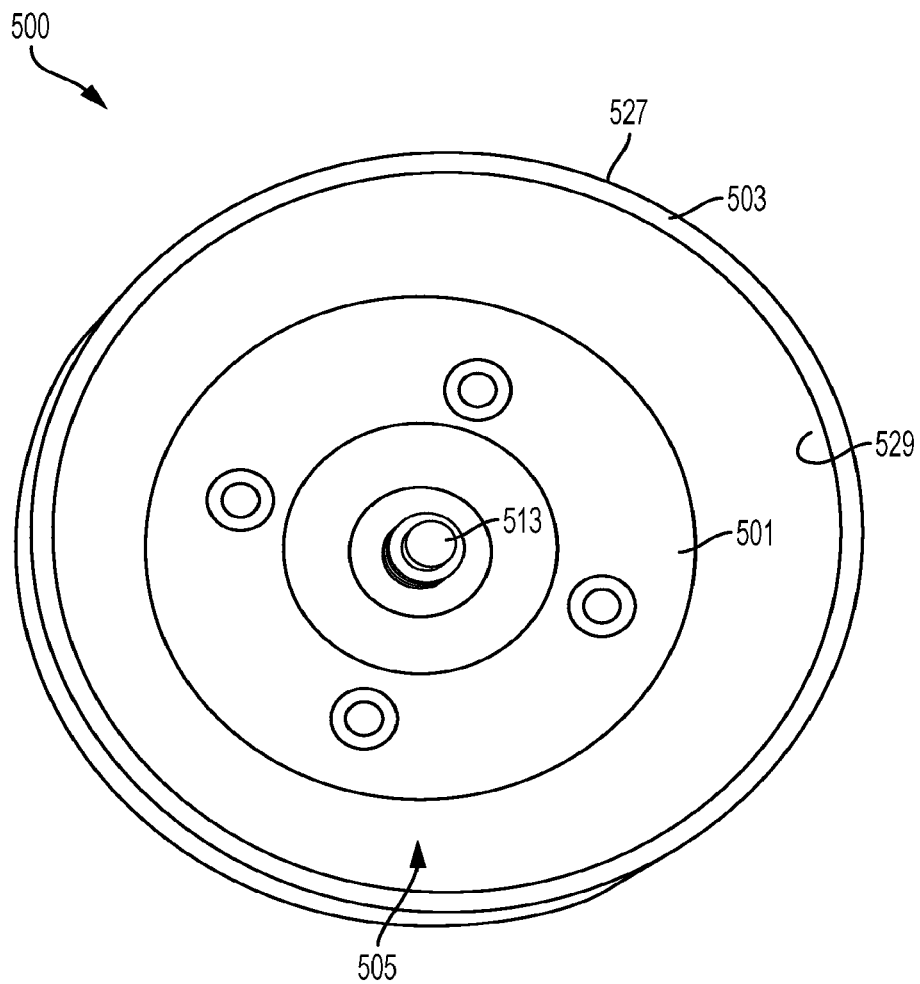
FIG. 5E is a perspective view of the connector of FIG. 5A, in accordance with several embodiments described in the present disclosure.

FIG. 5E is a perspective view of an embodiment of the connector 500. A screw 513 fits with the pin 511 (FIG. 5C). As shown, a threaded end of the screw 513 is visible. The screw has a head in which an end, opposite to the end 514 (FIG. 5C), of the pin 511 is fitted. The housing 501 has an outside surface 527 and an inside surface 529. The space 505 is surrounded partially by the inside surface 529.

Figure 5F:
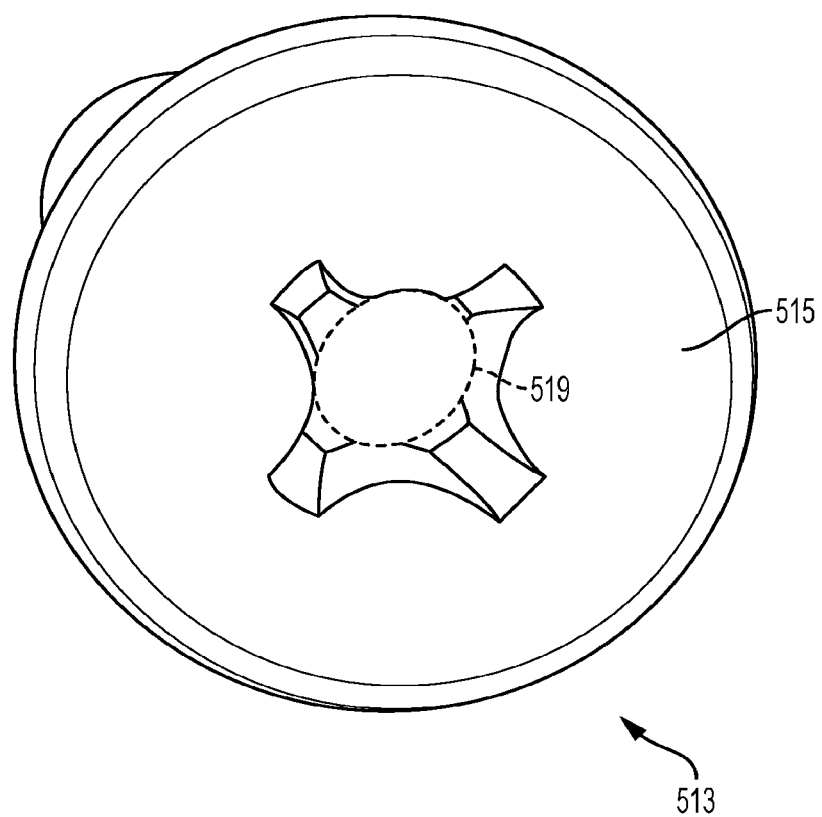
FIG. 5F is a front perspective view of a screw that is a part of the connector, in accordance with several embodiments described in the present disclosure.

FIG. 5F is a front perspective view of an embodiment of the screw 513. The screw 513 has a head 515, which includes a spacing 519. The spacing 519 extends into a threaded portion, which is illustrated below, of the screw 513. The end, opposite to the end 514 (FIG. 5C), of the pin 511 (FIG. 5C) is fitted into the spacing 519.

In various embodiments, the spacing 519 extends into the head 515 of the screw 513 without extending into the threaded portion of the screw 513.

In some embodiments, a cross-section of the spacing 519 has the same shape as that of a cross-section of the pin 511. For example, a diameter of the spacing 519 is slightly larger, e.g., by a fraction of a millimeter, etc., than a diameter of the pin 511 to enable to the pin 511 to fit inside the spacing 519. In various embodiments, a cross-section of the spacing 519 is of a different shape than that of a cross-section of the pin 511 while allowing the pin 511 to fit into the spacing 519.

Figure 5G:
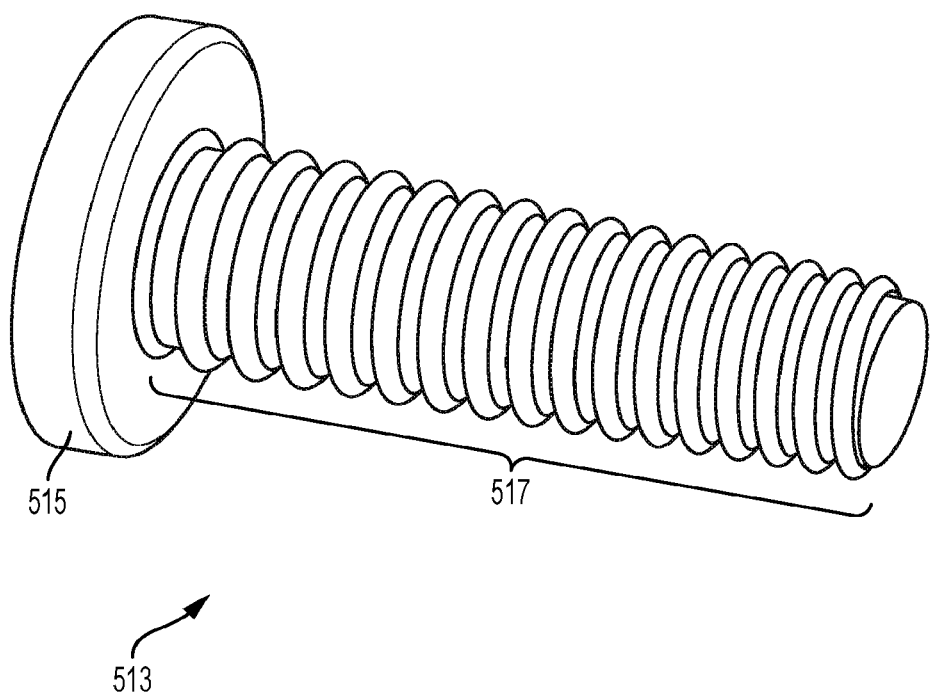
FIG. 5G is a view of the screw, in accordance with some embodiments described in the present disclosure.

FIG. 5G is a diagram of an embodiment of the screw 513. The screw 513 has the head 515 and a threaded end 517. The head 515 and the threaded end 517 extend into the spacing 505 (FIG. 5E) of the housing 501 (FIG. 5E) of the connector 500.

Figure 5H:
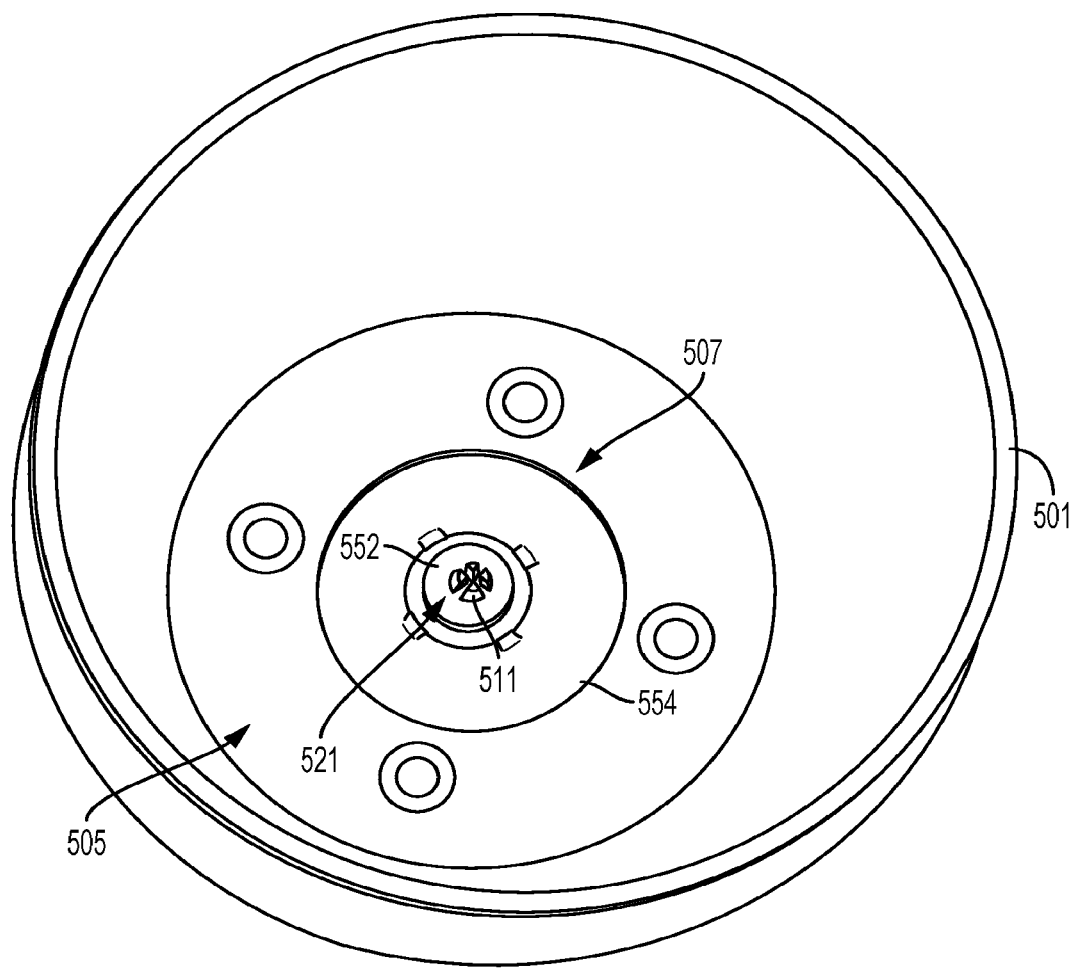
FIG. 5H is a view of a pin extending through a closed end of the connector, in accordance with various embodiments described in the present disclosure.

FIG. 5H is a perspective view of the pin 511 as extending through the closed end 509 (FIG. 5B) of the connector 500 into the spacing 505 formed inside the housing 501. The pin 511 has an end 521, which is located opposite to the end 514 (FIG. 5C). The end 521 fits into the spacing 519 (FIG. 5F) of the screw 513 (FIG. 5F). An insulating holder 552, e.g., a plastic insulator, a glass insulator, a porcelain insulator, etc., that is a part of the port 507 provides insulation between the screw 513 (FIG. 5G) and a metal ring 554, which abuts the closed end 509 (FIG. 5B) of the connector 500. The insulating holder 552 also supports the pin 511 that extends through the insulating holder 552. The metal ring 554 extends into the spacing 505 formed inside the housing 501.

In some embodiments, the metal ring 554 is excluded. In these embodiments, the insulator holder 552 abuts the closed end 509.

Figure 5I:
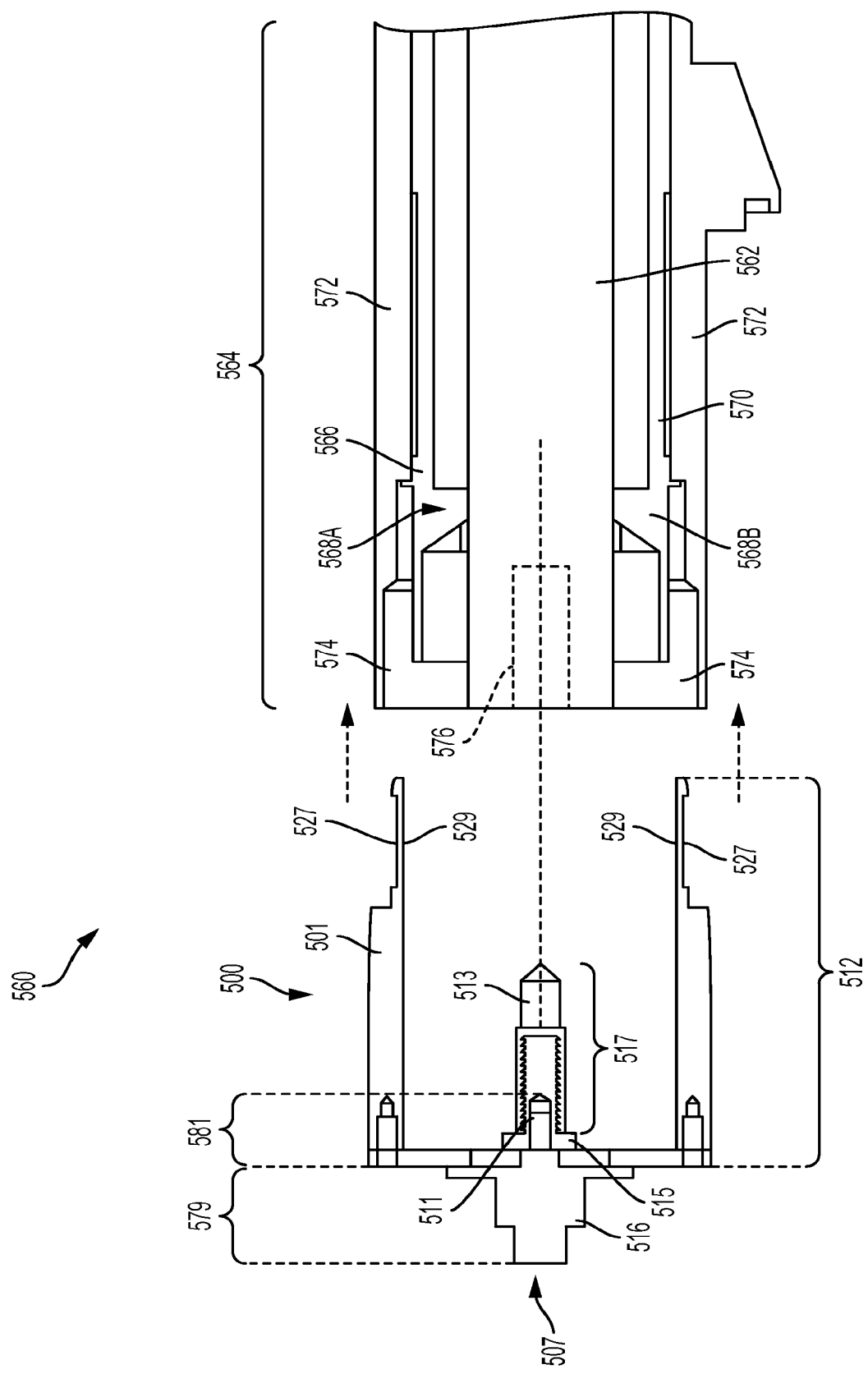
FIG. 5I is a diagram of a system for illustrating fitting of the connector with an RF rod, in accordance with some embodiments described in the present disclosure.

FIG. 5I is a diagram of an embodiment of a system 560 for illustrating a fitting of the connector 500 with an RF rod 562. The RF rod 562 is an example of the RF rod 442 (FIG. 4). The system 560 includes the connector 500 and a portion 564 of an RF transmission line, which is an example of the RF transmission line 406 (FIG. 4). The portion 564 is a portion of a transmission line portion, which is an example of the transmission line portion 122 (FIG. 1).

The portion 564 includes the RF rod 562, which is surrounded by an insulator layer 566, e.g., an insulator layer made of polytetrafluoroethylene, an insulator layer made of plastic, an insulator layer made of a synthetic resin, etc. The insulator layer 566 has spacers 568A and 568B that extend from a body 570 of the insulator 566 towards the RF rod 562. The insulator layer 566 is surrounded by an RF sheath 572, which is an example of the RF tunnel 436 (FIG. 4). In one embodiment, the RF sheath 572 forms an RF return path. There is a spacing 574 between the RF sheath 572 and the insulator layer 566 and also between the RF sheath 572 and the RF rod 562.

In several embodiments, air is used as an insulator and the air surrounds the RF rod 562 instead of the body 570. In these embodiments, the spacers 568A and 568B extend from the RF sheath 572 to the RF rod 562. In some embodiments, instead of the spacers 568A and 568B extend from the RF sheath 572 to the RF rod 562, the spacers 568A and 568B are connected to the RF sheath 572 to extend to the RF rod 562.

In some embodiments, the RF rod 562, the body 570, and the RF sheath 572 have a cross-section of the same shape, e.g., of a circular shape, of a rectangular shape, of an elliptical shape, etc.

In various embodiments, the RF rod 562, the body 570, and the RF sheath 572 have a cross-section of the same shape as that of the housing 501 of the connector 500.

The portion 512 of the housing 501 of the connector 500 extends into the spacing 574 to fit the connector 500 with the portion 564. When the portion 512 of the housing 501 extends into the spacing 574, the outside surface 527 (FIG. 5E) of the portion 512 abuts an inside surface of the RF sheath 572. For example, the RF sheath 572 wraps around the portion 512 when the outside surface 527 of the portion 512 is adjacent to the RF sheath 572. Moreover, when the portion 512 of the housing 501 extends into the spacing 574, the inside surface 529 of the portion 512 is adjacent to the insulator layer 566.

Also, when the portion 512 extends into the spacing 574, the threaded portion 517 of the screw 513 extends into a space 576 formed inside the RF rod 562 to enable electrical coupling between the pin 511 and the RF rod 562 via the screw 513. The space 576 is surrounded by threads that form a complementary relationship to the threaded portion 517 of the screw 513. As shown, the pin 511 extends into the threaded portion 517 of the screw 513 via the spacing 519 (FIG. 5F) in the head 515 of the screw 513.

In operation, an RF signal that is generated by the FGMD 302 (FIG. 3B) is sent via the cable 208 (FIG. 2) and the connector 204 (FIG. 2) to the pin 511. The RF signal is further transferred from the pin 511 via the threaded portion 517 of the screw 513 to the RF rod 562. The RF signal is modified to incorporate changes in one or more components of the plasma tool 100 (FIG. 1).

The modified RF signal is received by the pin 511 via the threaded portion 517 of the screw 513 from the RF rod 562 and further received by the sensor 312 (FIG. 3A) via the cable 208 and the connector 204 of the FGMD 202 (FIG. 2) from the pin 511. The sensor 312 detects the parameter of the modified RF signal and provides the parameter to the processor 314 of the host system 102 via the communication port of the host system 102 (FIG. 3A) for storage in the memory device 316 (FIG. 3A) of the host system 102. The parameter is accessed by the processor 314 (FIG. 3A) of the host system 102 from the memory device 316.

It should be noted that as shown in FIG. 5I, a portion 579 of the port 516 extends outside the housing 501 and a remaining portion 581 of the port 516 extends into the screw 513.

Figure 6A:
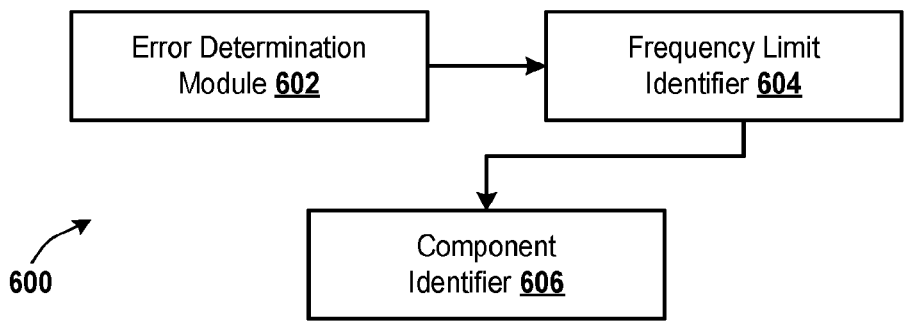
FIG. 6A is a diagram of a system for identifying one or more components of the plasma tool that generate an error in a parameter, in accordance with several embodiments described in the present disclosure.

FIG. 6A is a diagram of an embodiment of a system 600 for identifying one or more components of the plasma tool 100 (FIG. 1) that generate an error in the parameter. The system 600 is implemented within the processor 314 (FIG. 3A) of the host system 102.

The system 600 includes an error determination module 602 that is coupled to a frequency limit identifier module 604. The frequency limit identifier module 604 is connected to a component identifier module 606.

It should be noted that each module, as described herein, is implemented as software, hardware, or a combination thereof. For example, each module is a piece of a computer code that is executed by the processor 314. As another example, each module is a part of an integrated circuit, e.g., an ASIC, a PLD, etc. As yet another example, a portion of each module is implemented as a computer code and the remaining portion of the module is implemented as an integrated circuit.

Figure 6B:
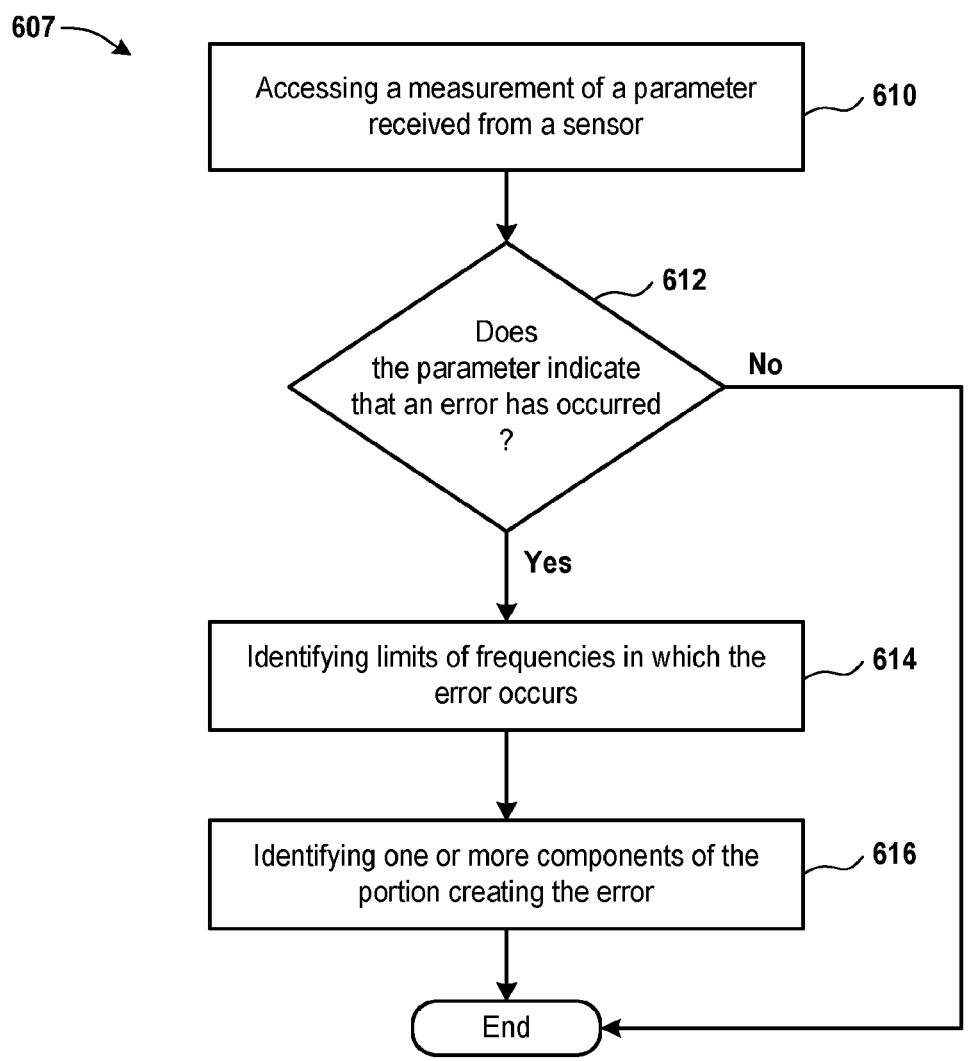
FIG. 6B is a flowchart of a method for identifying one or more components of the plasma tool that are faulty, in accordance with some embodiments described in the present disclosure.

FIG. 6B is a flowchart of an embodiment of a method 607 for identifying one or more components of the plasma tool 100 that are faulty. The method 607 is executed when the RF source 310 (FIG. 3A) is supplying RF signals having frequencies ranging in the frequency range n, e.g., the frequency range 1 or the frequency range 2, etc.

In an operation 610 of the method 607, when the RF signals having frequencies in the frequency range n are being supplied by the RF source 310, the processor 314 accesses the parameter that is measured by and received by the host system 102 (FIG. 3A) from the sensor 312 (FIG. 3A). The sensor 312 provides measured values of the parameter to the memory device 316 and the processor 314 accesses the parameter from the memory device 316.

In an operation 612 of the method 607, the error determination module 602 (FIG. 6A) determines whether the parameter indicates an error. For example, it is determined whether a magnitude of impedance of an RF signal that is sensed by the sensor 312 is outside pre-determined magnitude limits. Upon determining that the magnitude is outside the pre-determined magnitude limits, it is determined by the error determination module 602 that an error has occurred in the parameter. On the other hand, upon determining that the magnitude is within the pre-determined magnitude limits, it is determined by the error determination module 602 that an error has not occurred in the parameter. As another example, it is determined whether a phase of impedance of an RF signal sensed by the sensor 312 is outside pre-determined phase limits. Upon determining that the phase is outside the pre-determined phase limits, it is determined by the error determination module 602 that an error has occurred in the parameter. On the other hand, upon determining that the phase is within the pre-determined phase limits, it is determined by the error determination module 602 that an error has not occurred in the parameter.

As yet another example, with reference to FIG. 10A, it is determined whether a magnitude of an impedance of an RF signal that is sensed by the sensor 312 is outside a range between pre-determined confines C1 and C2 of magnitudes of impedance. In some embodiments, pre-determined confines, as described herein, are generated when the plasma tool 100 does not have a fault. FIG. 10A is an embodiment of a graph 1002 that plots magnitudes of impedances of RF signals that are sensed by the sensor 312 versus frequencies f of the RF signals. The frequencies f in the graph 1002 range between P1 MHz and P2 MHz, where each P1 is a real number greater than or equal to zero, and P2 is a real number greater than zero and greater than P1, etc. The graph 1002 includes three plots 1004, 1006, and 1008. The plots 1006 and 1008 are plotted for different gaps between the upper electrode 420 (FIG. 4) and the chuck 426 (FIG. 4). For example, when the plot 1006 is plotted, a gap between the upper electrode 420 and the chuck 426 is different from a gap of x millimeters (mm). Continuing with the example, when the plot 1008 is plotted, a gap between the upper electrode 420 and the chuck 426 is x mm.

Local minimas M1 and M2, e.g., minimas within the frequency range P1 MHz to P2 MHz, etc., of the plots 1006 and 1008 lie in a range between the pre-determined confines C1 and C2. Moreover, a local minima M3, e.g., a minima within the frequency range P1 MHz to P2 MHz, of the plot 1004 is located outside the pre-determined confines C1 and C2. When the error determination module 602 determines that the local minima M3 is located outside a range between the pre-determined confines C1 and C2, the error determination module 602 determines an error in the parameter has occurred. On the other hand, when the error determination module 602 determines that each local minima M1 and M2 is located within a range between the pre-determined confines C1 and C2, the error determination module 602 determines that an error in the parameter has not occurred.

As still another example, with reference to FIG. 10B, it is determined whether a phase of an impedance of an RF signal that is sensed by the sensor 312 has a slope that is outside a pre-determined range between slopes of pre-determined confines C3 and C4 of phases of impedance. FIG. 10B is an embodiment of a graph 1010 that plots phases of impedances of RF signals that are sensed by the sensor 312 versus frequencies f of the RF signals. The frequencies f plotted in the graph 1010 ranges from P1 MHz to P2 MHz. The graph 1010 includes three plots 1012, 1014, and 1016. The plots 1014 and 1016 are plotted for different gaps between the upper electrode 420 (FIG. 4) and the chuck 426 (FIG. 4). For example, when the plot 1014 is plotted, a gap between the upper electrode 420 and the chuck 426 is different from x mm In this example, when the plot 1016 is plotted, a gap between the upper electrode 420 and the chuck 426 is x mm.

A slope of a transition range T1 of the plot 1012 lies outside a pre-determined range between slopes of the pre-determined confines C3 and C4. The transition range T1 transitions from a high level LVL1 of a phase of an RF signal that is sensed by the sensor 312 to a low level LVL2 of a phase of the RF signal. The level LVL2 is lower than the high level LVL1. Moreover, a transition range T2 of the plot 1014 lies within the pre-determined confines C3 and C4. The transition range T2 transitions from the high level LVL1 of a phase of an RF signal to a low level LVL3 of a phase of the RF signal. Moreover, a transition range T3 of the plot 1016 lies within the pre-determined confines C3 and C4.

Also, the transition range T3 transitions from the high level LVL1 of a phase of an RF signal to the low level LVL3 of a phase of the RF signal. The level LVL3 is lower than the high level LVL1. It should be noted that a slope of a transition range defines whether the transition range is within the pre-determined confines C3 and C4. The slope of a transition range defines a shape of the transition range and the shape provides a quality of one or more components of the plasma tool 100 (FIG. 1).

When the error determination module 602 determines that the transition range T1 has a slope that is outside a pre-determined range between slopes of the pre-determined confines C3 and C4, the error determination module 602 determines that an error in the parameter has occurred. On the other hand, when the error determination module 602 determines that each transition range T2 and T3 has a slope that is within a pre-determined range between slopes of the pre-determined confines C3 and C4, the error determination module 602 determines that an error in the parameter has not occurred.

In one embodiment, instead of or in addition to comparing slope of a transition range with slopes of the pre-determined confines C3 and C4, the error determination module 602 determines whether a zero crossing of the transition range, e.g., a frequency at which a phase of the transition range is zero, etc., is within a range of frequencies at which the pre-determined confines C3 and C4 have their zero crossings, e.g., frequencies at which the phases of the pre-determined confines C3 and C4 are zero, etc. For example, upon determining that the zero crossing of the transition range is within the range of frequencies at which the pre-determined confines C3 and C4 have their zero crossings, the error determination module 602 determines that an error in the parameter has not occurred. On the other hand, upon determining that the zero crossing of the transition range is outside the range of frequencies at which the pre-determined confines C3 and C4 have their zero crossings, the error determination module 602 determines that an error in the parameter has occurred. It should be noted that a frequency at which a phase of an RF signal is zero is a resonant frequency of the RF signal. As another example, upon determining that the transition range T1 has a slope that is outside a pre-determined range between slopes of the pre-determined confines C3 and C4 and the zero crossing of the transition range T1 is outside the range of frequencies at which the pre-determined confines C3 and C4 have their zero crossings, the error determination module 602 determines that an error in the parameter has occurred. On the other hand, upon determining that the transition range T1 has a slope that is within a pre-determined range between slopes of the pre-determined confines C3 and C4 and the zero crossing of the transition range T1 is within the range of frequencies at which the pre-determined confines C3 and C4 have their zero crossings, the error determination module 602 determines that an error in the parameter has not occurred.

Figure 11:
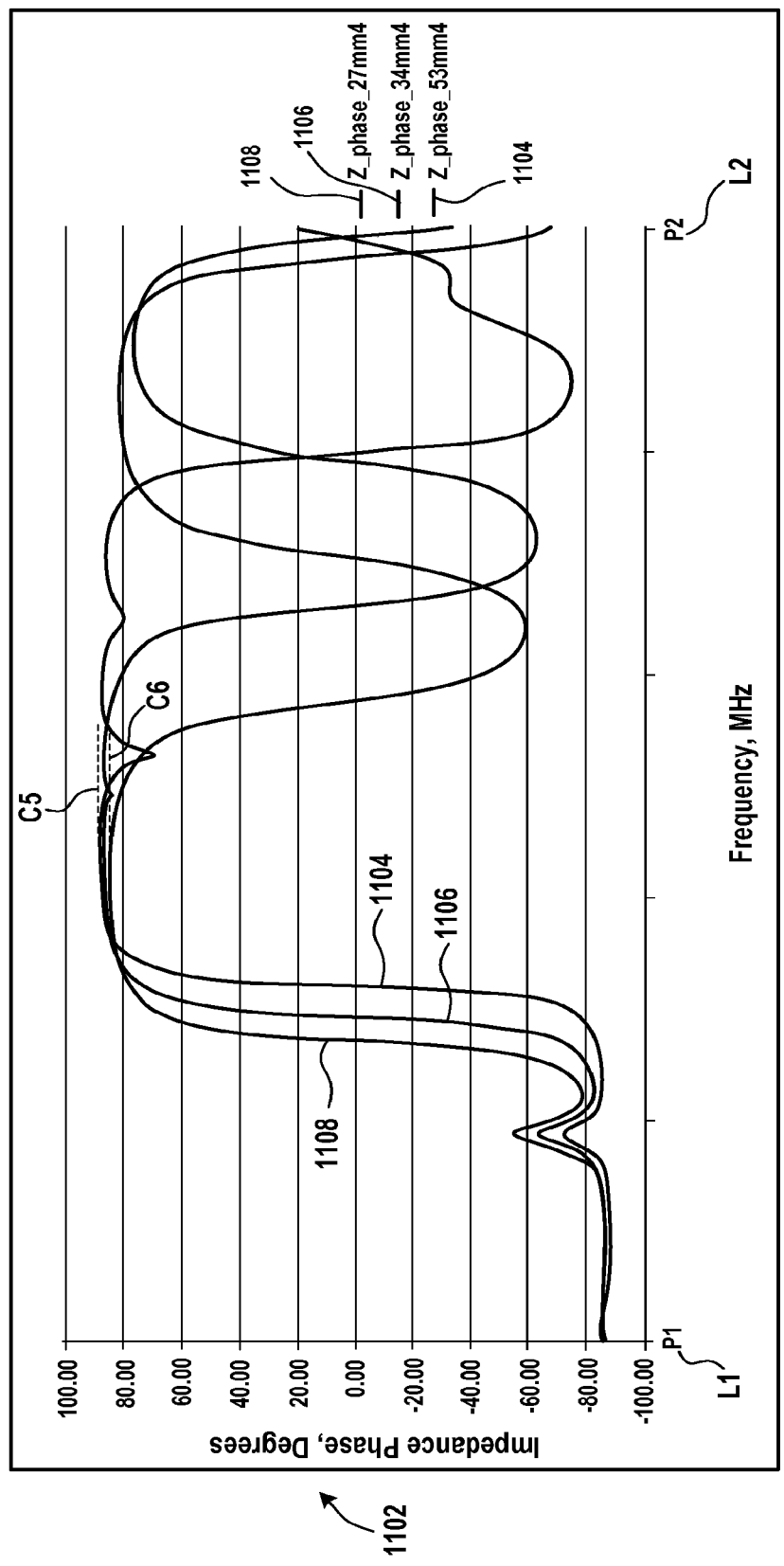
FIG. 11 is a graph that plots phases of impedances of RF signals that are sensed by the sensor versus frequencies f of the RF signals, in accordance with some embodiments described in the present disclosure.

As another example, with reference to FIG. 11, it is determined whether a phase of an impedance of an RF signal that is sensed by the sensor 312 is outside a range between pre-determined confines C5 and C6 of phases of impedance. FIG. 11 is an embodiment of a graph 1102 that plots phases of impedances of RF signals that are sensed by the sensor 312 versus frequencies f of the RF signals. The frequencies f plotted in the graph 1102 range from P1 MHz to P2 MHz. The graph 1102 include plots 1104, 1106, and 1108. The plots 1104, 1106 and 1108 are plotted to determine that a gap between the upper electrode 420 (FIG. 4) and the chuck 426

(FIG. 4) has increased to a level that is outside a pre-determined level. For example, the plot 1108 is plotted at a time a gap between the upper electrode 420 and the chuck 426 is 27 mm, the plot 1106 is plotted at a time the gap is 34 mm, and the plot 1104 is plotted at a time the gap is 53 mm. When the error determination module 602 determines that a phase plotted in the plot 1108 of an RF signal that is sensed by the sensor 312 is outside a range between the pre-determined confines C5 and C6, the error determination module 602 determines an error in the parameter has occurred. On the other hand, when the error determination module 602 determines that phases plotted in the plots 1104 and 1106 of RF signals that are sensed by the sensor 312 are within a range between the pre-determined confines C5 and C6, the error determination module 602 determines an error in the parameter has not occurred. It should be noted that when a gap between the chuck 426 (FIG. 4) and the upper electrode 420 (FIG. 4) is 27 mm or 34 mm, there is no fault in the plasma reactor 402 (FIG. 4). On the other hand, when a gap between the chuck 426 and the upper electrode 420 increases to 53 mm, there is a fault in the plasma reactor 402.

Figure 12A:
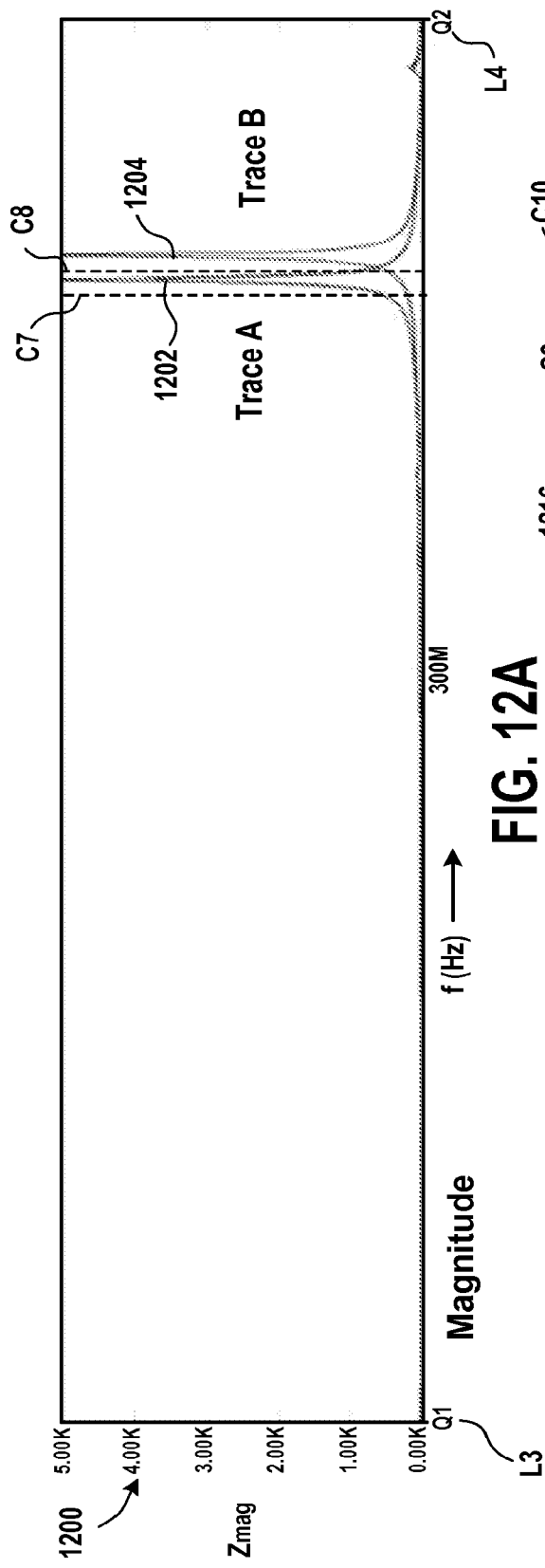
FIG. 12A is a graph that plots magnitudes of impedances of RF signals that are sensed by the sensor versus frequencies f of the RF signals, in accordance with several embodiments described in the present disclosure.

As another example, with reference to FIG. 12A, it is determined whether a magnitude of impedance of an RF signal that is sensed by the sensor 312 is outside a range between pre-determined confines C7 and C8 of frequencies of RF signals that are sensed by the sensor 312. FIG. 12A is an embodiment of a graph 1200 that plots magnitudes of impedances of RF signals that are sensed by the sensor 312 versus frequencies f of the RF signals. The frequencies f plotted in the graph 1200 ranges from Q1 MHz to Q2 MHz, where Q1 is a real number greater than or equal to zero, and Q2 is a real number greater than zero and greater than Q1, etc. The graph 1200 includes plots 1202 and 1204. As shown in the plot 1204, a local maximum of the plot 1204 occurs outside the pre-determined confines C7 and C8. The pre-determined confines C7 and C8 provides frequency limits for the plot 1202, which is plotted when the plasma tool 100 does not have a fault. When the error determination module 602 determines that a local maximum of a magnitude of impedance plotted in the plot 1204 of an RF signal that is sensed by the sensor 312 is outside a range between the pre-determined confines C7 and C8, the error determination module 602 determines an error in the parameter has occurred. On the other hand, when the error determination module 602 determines that a local maximum of a magnitude of impedance plotted in the plot 1202 of an RF signal that is sensed by the sensor 312 is within a range between the pre-determined confines C7 and C8, the error determination module 602 determines an error in the parameter has not occurred.

Figure 12B:
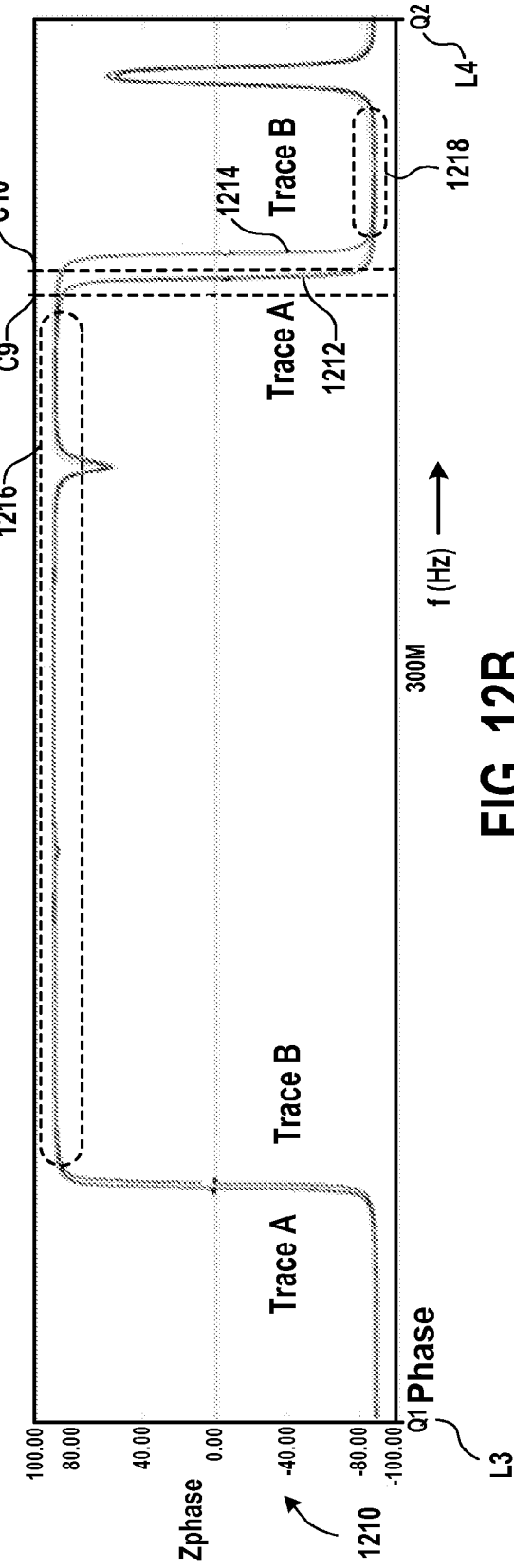
FIG. 12B is a graph that plots phases of impedances of RF signals that are sensed by the sensor versus frequencies of the RF signals, in accordance with various embodiments described in the present disclosure.

As yet another example, with reference to FIG. 12B, it is determined whether a phase of impedance of an RF signal that is sensed by the sensor 312 is outside a range between pre-determined confines C9 and C10 of frequencies of RF signals that are sensed by the sensor 312. FIG. 12B is an embodiment of a graph 1210 that plots phases of impedances of RF signals that are sensed by the sensor 312 versus frequencies f of the RF signals. The frequencies f plotted in the graph 1210 ranges from Q1 MHz to Q2 MHz. The graph 1210 includes plots 1212 and 1214. As shown in the plot 1214, a phase transition from a high phase level 1216 of the plot 1212 to a low phase level 1218 of the plot 1212 occurs outside the pre-determined confines C9 and C10. Moreover, as shown in the plot 1212, a phase transition from the high phase level 1216 of the plot 1212 to the low phase level 1218 of the plot 1212 occurs within the pre-determined confines C9 and C10. The pre-determined confines C9 and C10 provides frequency limits for the plot 1212, which is plotted when the plasma tool 100 does not have a fault. When the error determination module 602 determines that a transition of phases of RF signals that are sensed by the sensor 312 and plotted in the plot 1214 is outside a range between the pre-determined confines C9 and C10, the error determination module 602 determines an error in the parameter has occurred. On the other hand, when the error determination module 602 determines that a transition of phases of RF signals that are sensed by the sensor 312 and plotted in the plot 1212 is within a range between the pre-determined confines C9 and C10, the error determination module 602 determines an error in the parameter has not occurred.

Referring back to FIGS. 6A and 6B, in response to determining that the parameter indicates that an error has not occurred, the method 607 ends. On the other hand, in response to determining that the parameter indicates that an error has occurred, in an operation 614, the frequency limits identifier 604 identifies limits of frequencies in which the error occurs. For example, referring to FIG. 10A, the frequency limits identifier 604 identifies that limits of frequencies in which an error in a magnitude of impedance of an RF signal that is sensed by the sensor 312 occurs include L1, e.g., P1 MHz, etc., and L2, e.g., P2 MHz, etc. As another example, referring to FIG. 10B, the frequency limits identifier 604 identifies that limits of frequencies in which an error in a phase transition of impedance of an RF signal that is sensed by the sensor 312 occurs include L1 and L2. As yet another example, referring to FIG. 11, the frequency limits identifier 604 identifies that limits of frequencies in which an error in a phase of impedance of an RF signal that is sensed by the sensor 312 occurs include L1 and L2. As another example, referring to FIG. 12A, the frequency limits identifier 604 identifies that limits of frequencies in which an error in a magnitude of impedance of an RF signal that is sensed by the sensor 312 occurs include L3, e.g., Q1 MHz, etc., and L4, e.g., Q2 MHz. As yet another example, referring to FIG. 12B, the frequency limits identifier 604 identifies that limits of frequencies in which an error in a transition of phases of impedances of RF signals that are sensed by the sensor 312 occurs include L3 and L4.

In some embodiments, limits of frequencies in which an error of the parameter occurs are determined by the frequency limits identifier 604 to include values of frequencies in which the error in the parameter is indicated and the values are within a range of values of frequencies that indicate lack of the error. For example, as shown in FIG. 10A, the plots 1004, 1006, and 1008 are uniform starting at a frequency of P1 MHz until a frequency value V1, lack uniformity from the value V1 to a frequency value V2, and then are uniform from the frequency value V2 to a frequency of P2 MHz. As visible in FIG. 10B, the plots 1004, 1006, and 1008 are uniform in that they have similar slope, e.g., same slope, slope within a pre-determined slope range, etc., between the frequency of P1 MHz and the value V1, are not uniform in that they have different slopes between the value V1 and the value V2, and are uniform in that they have the similar slope between the value V2 and the frequency of P2 MHz. As another example, limits of frequencies in which an error of the parameter occurs are determined by the frequency limits identifier 604 to include values of frequencies in which the error in the parameter is indicated and the values lie between a first set of values of frequencies that indicate lack of the error and a second set of values that indicate lack of the error.

In some embodiments, the frequency limits identifier 604 identifies limits of frequencies to include values of frequencies in which an error in the parameter occurs and to exclude values of frequencies in which the error does not occur. For example, with reference back to FIG. 10A, limits of frequencies are identified to be between V1 and V2 and not between P1 MHz and P2 MHz. Slopes of the plots 1004, 1006, and 1008 are similar between P1 MHz and the frequency value of V1 and between V2 and the frequency value of P2 MHz. The frequency values between P1 MHz and V1 and between the frequency value V2 and P2 MHz are excluded by the frequency limits identifier 604 in determining limits of frequencies in which an error in the parameter occurs.

In various embodiments, limits of frequencies in which an error of the parameter occurs are provided as pre-determined limits to the frequency limits identifier 604 by the user via the input device of the host system 102 (FIG. 1). For example, the user provides via the input device of the host system 102 that when an error in the parameter is determined at a frequency value f1, the pre-determined limits of frequencies extend between +11 MHz from the frequency value f1 and −11 MHz from the frequency value f1, where 11 is a real number greater than zero, etc.

Referring back to FIGS. 6A and 6B, in an operation 616, the component identifier module 606 identifies one or more components of the portion of the plasma tool 100 creating an error in the parameter based on the frequency limits identified in the operation 614. For example, with reference to FIGS. 10A and 10B, upon determining by the component identifier module 606 that the frequency limits L1 and L2 associated with an impedance magnitude minima or a phase transition match pre-stored frequency limits, e.g., P1 MHz and P2 MHz, etc., it is determined by the component identifier module 606 that an error in the parameter is generated by the upper electrode 420, or the C-shroud 424, or the upper electrode extension 422 (FIG. 4). A mapping between the pre-stored frequency limits and one or more components is stored in the memory device 316 (FIG. 3) of the host device 102 (FIG. 3A). It should be noted that the frequency limit L1 is matched to the pre-stored frequency limit of P1 MHz and the frequency limit L2 is matched to the pre-stored frequency limit of P2 MHz.

As another example, with reference to FIGS. 10A and 10B, upon determining by the component identifier module 606 that the frequency limits L1 and L2 associated with an impedance magnitude minima or associated with a phase transition match pre-stored frequency limits, e.g., P1 MHz and P2 MHz, etc., it is determined by the component identifier module 606 that an error in the parameter is generated by the upper electrode 420. It should be noted that the frequency limit L1 is matched by the component identifier module 606 to the pre-stored frequency limit of P1 MHz and the frequency limit L2 is matched by the component identifier module 606 to the pre-stored frequency limit of P2 MHz. As yet another example, with reference to FIG. 11, upon determining by the component identifier module 606 that the frequency limits L1 and L2 associated with a phase of an RF signals match pre-stored frequency limits, e.g., P1 MHz and P2 MHz, etc., it is determined by the component identifier module 606 that an error in the parameter is generated by the C-shroud 424. As another example, with reference to FIGS. 12A and 12B, upon determining by the component identifier module 606 that the frequency limits L3 and L4 associated with an impedance magnitude maxima or associated with a phase transition match pre-stored frequency limits, e.g., Q1 MHz and Q2 MHz, etc., it is determined by the component identifier module 606 that an error in the parameter is generated as a result of a displacement, e.g., movement, etc., in the spacers 568A and 568B (FIG. 5I).

In some embodiments, instead of determining whether the frequency limits L1 and L2 match pre-stored frequency limits, e.g., P1 MHz and P2 MHz, etc., it is determined by the component identifier module 606 whether the frequency limit L1 is within a threshold range of a pre-stored lower frequency limit, e.g., P1 MHz and whether the frequency limit L2 is within a threshold range of a pre-stored upper frequency limit, e.g., P2 MHz, etc.

In various embodiments, instead of determining whether the frequency limits L3 and L4 match pre-stored frequency limits, e.g., Q1 MHz and Q2 MHz, etc., it is determined by the component identifier module 606 whether the frequency limit L3 is within a threshold range of a pre-stored lower frequency limit, e.g., Q1 MHz and whether the frequency limit L4 is within a threshold range of a pre-stored upper frequency limit, e.g., Q2 MHz, etc.

Figure 7A:
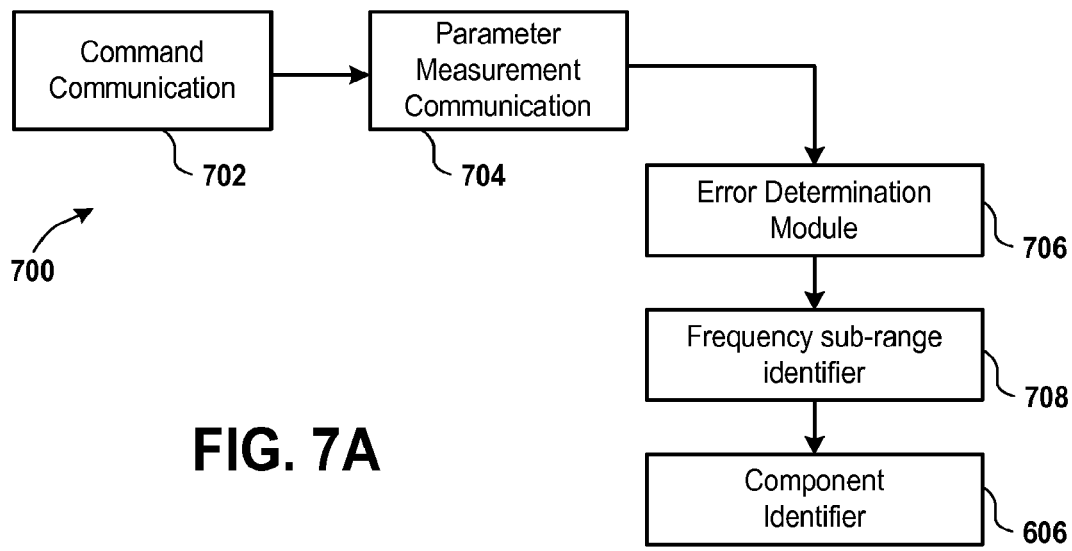
FIG. 7A is a diagram of a system for illustrating a method for testing the plasma tool, in accordance with various embodiments described in the present disclosure.

FIG. 7A is a diagram of an embodiment of a system 700 for illustrating a method for testing the plasma tool 100 (FIG. 1). The system 700 is implemented within the processor 314 (FIG. 3A) of the host system 102 (FIG. 1). The system 700 includes a command communication module 702, a parameter measurement communication module 704, an error determination module 706, a frequency sub-range identifier module 708, and the component identifier 606. The parameter measurement communication module 704 includes the communication port, described above.

In an embodiment, a communication module includes a serial port for transferring data serially, a parallel port for transferring data in a parallel manner, or a USB port.

The command communication module 702 is located in the host system 102 (FIG. 1) and is coupled to the processor 314 of the host system 102. When the processor 314 provides a command to the command communication module 702, the command communication module sends the command to a communication module (not shown) of the FGMD 302 (FIG. 3B). The command communication module of the FGMD 202 is coupled to the controller 306 (FIG. 3B) of the FGMD 302.

Moreover, the parameter measurement communication module 704 is located in the host system 102 and is coupled to the processor 314 of the host system 102. In some embodiments, the command communication module 702 and the parameter measurement communication module 704 are the same communication module.

Figure 7B:
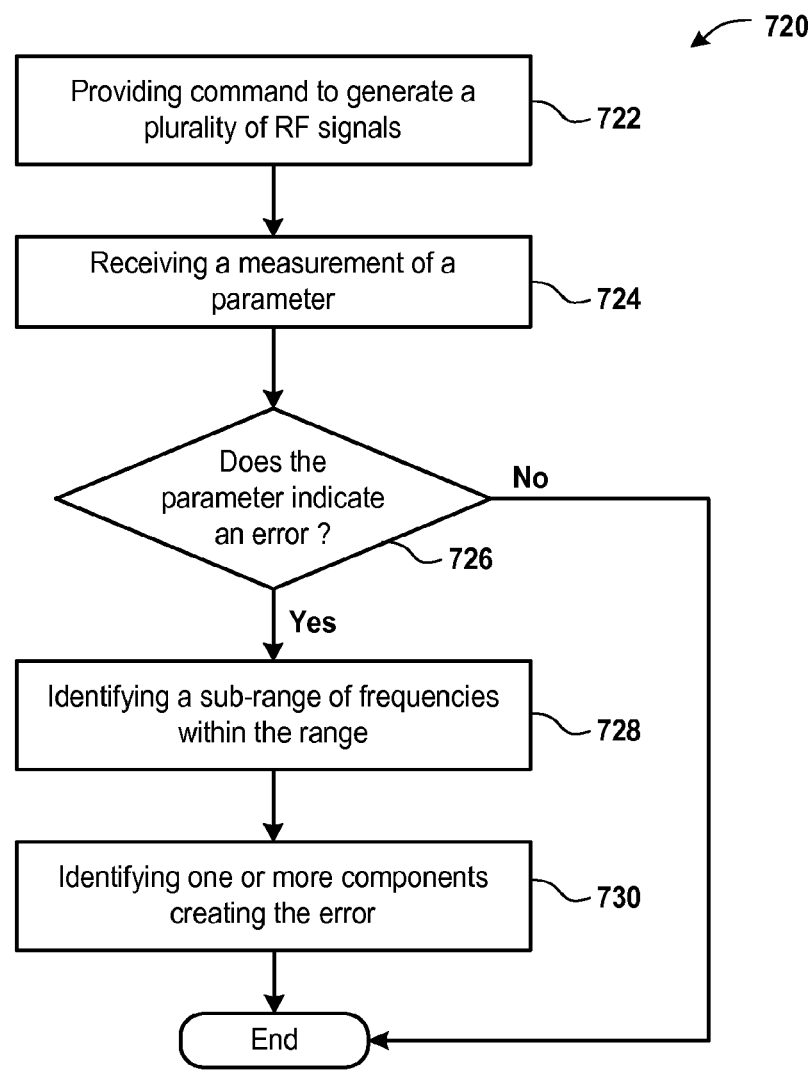
FIG. 7B is a flowchart of a method for illustrating testing of the plasma system for identifying one or more components having an error in the parameter, in accordance with various embodiments described in the present disclosure.

FIG. 7B is a flowchart of an embodiment of a method 720 for illustrating testing of the plasma tool 100 for identifying one or more components generating an error in the parameter. In an operation 722 of the method 720, the command communication module 702 (FIG. 7A) communicates a command to the communication module of the FGMD 302 (FIG. 3B). The command is to generate multiple RF signals having multiple frequencies. For example, the command is to generate RF signals having the frequency ranges 1 thru n (FIG. 3A). The command is provided by the communication module of the FGMD 302 to the controller 306 (FIG. 3B) of the FGMD 302. The controller 306 provides the frequency ranges 1 thru n to the RF power supply 310 (FIG. 3B) in response to receiving the command. The RF power supply 310 generates RF signals having the frequency ranges 1 thru n.

In some embodiments, the command includes the frequency ranges 1 thru n. In various embodiments, the command includes power levels, e.g., power values, etc., associated with the frequency ranges 1 thru n for generating RF signals.

In an operation 724 of the method 720, measurement, e.g., values, etc., of the parameter are received by the parameter measurement communication module 704 (FIG. 7A) from the communication module of the FGMD 302. The measurement is made by the sensor 312 (FIG. 3B) of the FGMD 302, provided by the sensor 312 to the controller 306 of the FGMD 302 for storage in the memory device 308 (FIG. 3B) of the FGMD 302. The controller 306 of the FGMD 302 accesses the measurement from the memory device 308 and provides the measurement to the parameter measurement communication module 704 via the communication module of the FGMD 302.

In an operation 726, the error determination module 706 determines whether the measurement indicates an error in the parameter. For example, with reference to FIG. 9A, the error determination module 706 determines whether a magnitude of the parameter is within a pre-defined upper limit UL1 and a pre-defined lower limit LL1 of magnitudes of the parameter. FIG. 9A plots magnitudes of the parameter determined by the sensor 312 (FIG. 3A) by sensing RF signals having frequencies in the frequency ranges 1 thru n. The frequencies of the RF signals in the frequency ranges 1 thru n range from a frequency value R1 to a frequency value R2, where R1 is a real number greater than or equal to zero, and R2 is a real number greater than zero and greater than R1, etc. In response to determining that a magnitude of the parameter is within the pre-defined upper limit UL1 and the pre-defined lower limit LL1 of magnitudes of the parameter, the error determination module 706 determines that there is a lack of an error in the parameter. On the other hand, in response to determining that a magnitude of the parameter is outside the pre-defined upper limit UL1 and the pre-defined lower limit LL1 of magnitudes of the parameter, the error determination module 706 determines that there is an error in the parameter.

As another example, with reference to FIG. 9B, the error determination module 706 determines whether a phase of the parameter is within a pre-defined upper limit UL2 and a pre-defined lower limit LL2 of phases of the parameter. FIG. 9B plots phases of the parameter determined by the sensor 312 (FIG. 3A) by sensing RF signals having frequencies in the frequency ranges 1 thru n. In response to determining that a phase of the parameter is within the pre-defined upper limit UL2 and the pre-defined lower limit LL2 of phases of the parameter, the error determination module 706 determines that there is a lack of an error in the parameter. On the other hand, in response to determining that a phase of the parameter is outside the pre-defined upper limit UL2 and the pre-defined lower limit LL2 of phases of the parameter, the error determination module 706 determines that there is an error in the parameter.

Figure 9C:
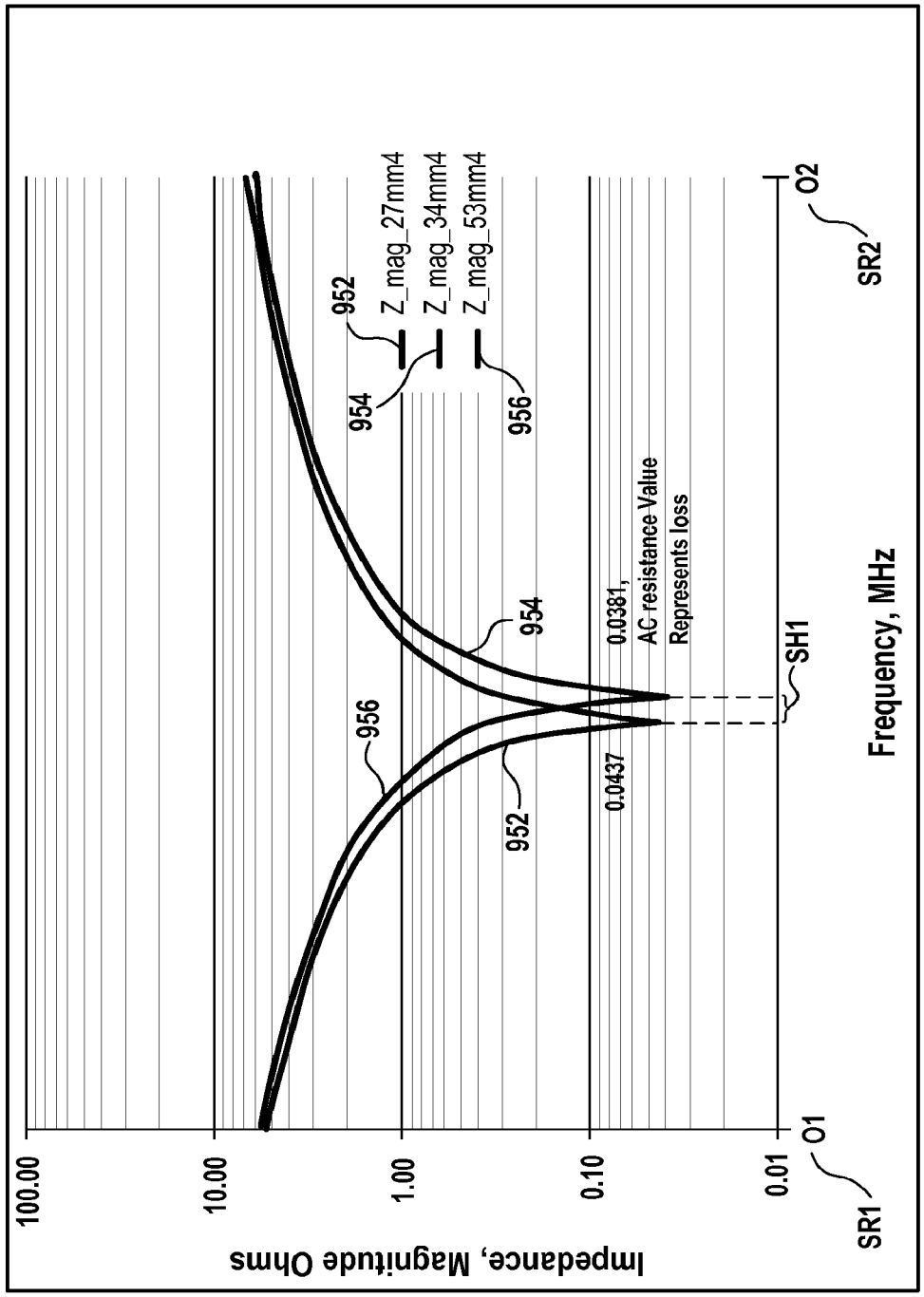
FIG. 9C is a graph that plots a magnitude of impedance determined by a sensor by sensing RF signals having the frequency ranges 1 thru n, in accordance with some embodiments described in the present disclosure.

As yet another example, with reference to FIG. 9C, the error determination module 706 determines whether there is a shift SH1 in a magnitude of impedance determined by the sensor 312. The shift SH1 represents a system loss, e.g., loss of power by the portion 104, or 106, or 108, or 110 (FIG. 1), etc. The magnitude is determined when the plasma tool 100 does not create an error in the parameter. FIG. 9C is an embodiment of a graph 950 that plots a magnitude of impedance determined by the sensor 312 by sensing RF signals having the frequency ranges 1 thru n. An example of a lower limit of frequencies within the frequency ranges 1 thru n includes a frequency value SR1, e.g., O1 MHz, etc., and an example of an upper limit of frequencies within the frequency ranges 1 thru n includes a frequency value SR2, e.g., O2 MHz, etc., where O1 is a real number greater than or equal to zero, and O2 is a real number greater than zero and greater than O1, etc. In response to determining that the shift SH1 in the parameter has not occurred, the error determination module 706 determines that there is a lack of an error in the parameter. On the other hand, in response to determining that the shift SH1 in the parameter has occurred, the error determination module 706 determines that there is an error in the parameter. In some embodiments, the shift SH1 is a pre-determined shift value.

It should be noted that the shift SH1 is created by a change in a gap between the upper electrode 420 and the chuck 426 (FIG. 4). For example, a plot 952 of the graph 950 corresponds to a gap of 27 millimeters, a plot 954 of the graph 950 corresponds to a gap of 34 millimeters, and a plot 956 of the graph 950 corresponds to a gap of 53 millimeters. The plot 954 coincides with the plot 956.

In one embodiment, a change in an amount of gap between the upper electrode 420 and the chuck 426 does not result in a shift. For example, impedance magnitude measured when the gap is changed from 34 mm to 53 mm or vice versa is represented by the plots 954 and 956, which coincide. However, with reference to FIG. 11, described further below, the change in the amount of gap results in a change in a resonant frequency, which is further described below.

Referring back to FIGS. 7A and 7B, upon determining that the measurement does not indicate an error in the parameter, the method 720 ends. On the other hand, upon determining that the measurement indicates an error in the parameter, in an operation 728, the frequency sub-range identifier module 708 identifies a sub-range of frequencies within the ranges 1 thru n. The sub-range is identified in a similar manner to that of the operation 614 (FIG. 6B) of identifying the limits in frequencies in which an error in the parameter occurs. For example, the sub-range is within a pre-determined range of a frequency at which an error in the parameter occurs. To further illustrate, the sub-range is within a pre-determined range, e.g., ±a1 MHz, etc., of a frequency at which the shift SH1 occurs, where a1 is a real number greater than zero, etc. As another example, the sub-range is within a pre-determined range of a frequency at which an error in a phase of impedance occurs. As another example, the sub-range is one of the ranges 1 thru n. As another example, the values V1 and V2 in FIG. 10A are examples of lower and upper limits of the sub-range. As yet another example, the values L1 and L2 in FIGS. 10A, 10B, and 11 are examples of lower and upper limits of the sub-range. As yet another example, the values L3 and L4 in FIGS. 12A and 12B are examples of lower and upper limits of the sub-range.

In an operation 730, the component identifier 606 identifies one or more components creating a fault in the portion of the plasma tool 100 in a manner similar to the operation 616 (FIG. 6B). For example, upon determining by the component identifier module 606 that the frequency limits L1 and L2 matches or is within a pre-determined range of pre-stored frequency limits, e.g., P1 MHz and P2 MHz, etc., it is determined by the component identifier module 606 that an error in the parameter is generated by the upper electrode 420 (FIG. 4).

Figure 8:
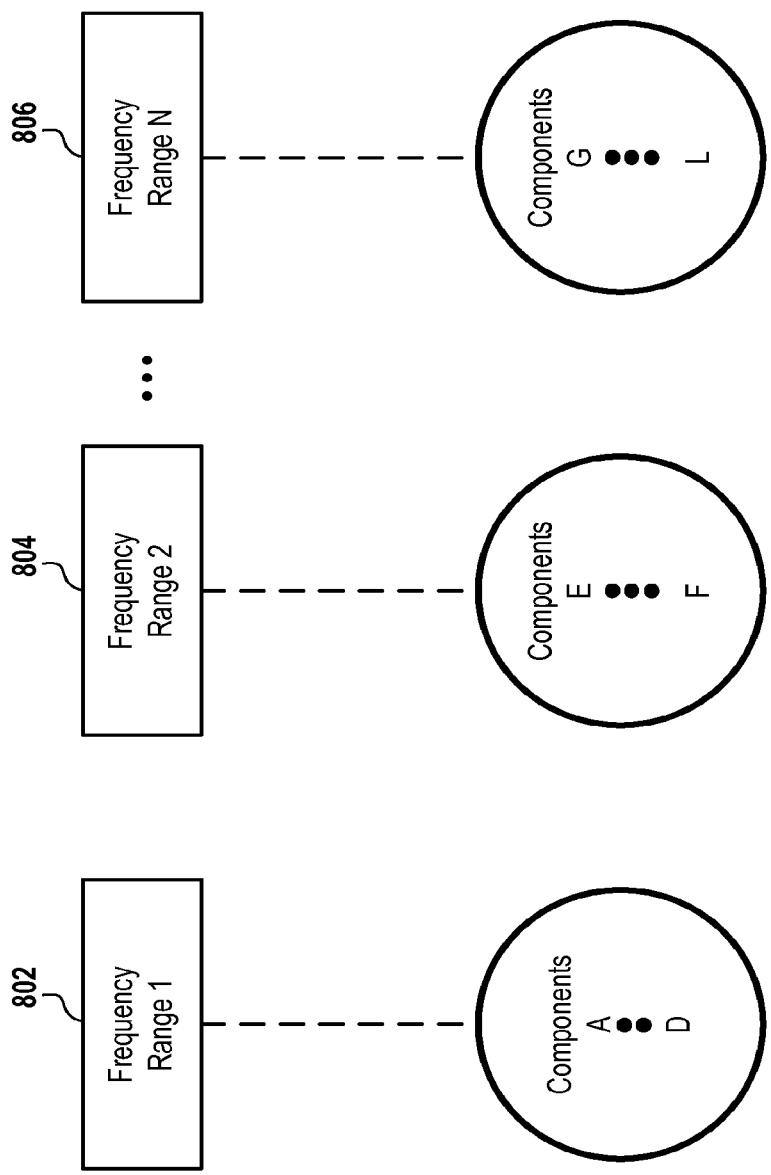
FIG. 8 is a diagram illustrating that frequency ranges are used to identify different sets of components of the plasma tool, in accordance with several embodiments described in the present disclosure.

FIG. 8 is a diagram illustrating that frequency ranges are used to identify different sets of components. For example, the frequency range 802 is used to identify components A, B, C, and D of the plasma tool 100 (FIG. 1). To further illustrate, when limits of frequencies identified in the operation 614 (FIG. 6B) lie within the frequency range 802, the component identifier module 606 (FIG. 6A) identifies the components A thru D as creating an error in the parameter. As another illustration, when the sub-range identified in the operation 728 (FIG. 7B) includes the frequency range 802, the component identifier module 606 (FIG. 7B) identifies the components A thru D as creating an error in the parameter.

As yet another example, the frequency range 804 is used to identify components E and F of the plasma tool 100. To further illustrate, when limits of frequencies identified in the operation 614 lie within the frequency range 804, the component identifier module 606 identifies the components E and F as creating an error in the parameter. As another illustration, when the sub-range identified in the operation 728 includes the frequency range 804, the component identifier module 606 identifies the components E and F as creating an error in the parameter.

As another example, the frequency range 806 is used to identify components G, H, I, J, K, and L of the plasma tool 100. To further illustrate, when limits of frequencies identified in the operation 614 lie within the frequency range 806, the component identifier module 606 identifies the components G thru L as creating an error in the parameter. As another illustration, when the sub-range identified in the operation 728 includes the frequency range 806, the component identifier module 606 identifies the components G thru L as creating an error in the parameter.

In various embodiments, each frequency range 802, 804, and 806 is associated with a fault in any number of components. For example, the frequency range 802 is associated with faults in three components instead of four. As another example, the frequency range 806 is associated with faults in five components instead of six.

In some embodiments, a component is identified as creating an error in the parameter based on multiple different frequency ranges. For example, when limits of frequencies identified in the operation 614 lie within the frequency range 806, the component identifier module 606 identifies the component G as creating an error in the parameter. Moreover, in this example, when limits of frequencies identified in the operation 614 lie within the frequency range 804, the component identifier module 606 identifies the same component G as creating an error in the parameter. As another example, when the sub-range identified in the operation 728 includes the frequency range 806, the component identifier module 606 identifies the component L as creating an error in the parameter. Also, in this example, when the sub-range identified in the operation 728 includes the frequency range 802, the component identifier module 606 identifies the component L as creating an error in the parameter.

Figure 13A:
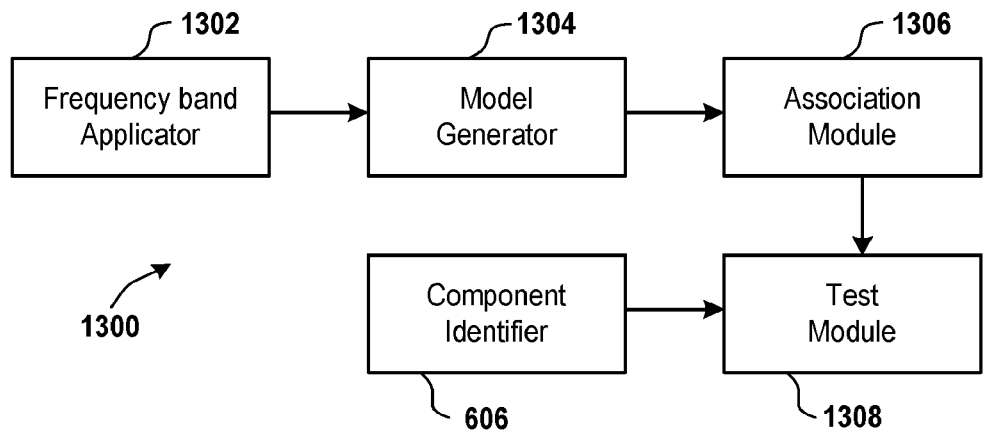
FIG. 13A is a diagram of a system for determining frequencies of faulty components of the plasma tool of FIG. 1 and for identifying a faulty component of the plasma tool, in accordance with some embodiments described in the present disclosure.

FIG. 13A is a diagram of an embodiment of a system 1300 for determining frequencies of faulty components of the plasma tool 100 (FIG. 1) and for identifying a faulty component of the plasma tool 100. The system 1300 includes a frequency band applicator 1302, a model generator 1304, an association module 1306, a test module 1308, and the component identifier 606. The FGMD 302 (FIG. 3A) or a combination of the FGMD 302 and the processor 314 of the host system 102 (FIG. 3A) are examples of the frequency band applicator 1302. The processor 314 of the host system 102 is an example of each of the model generator 1304 and the association module 1306. The FGMD 302 or a combination of the FGMD 302 and the processor 314 are examples of the test module 1308. The processor 314 is an example of the component identifier 606.

Figure 13B:
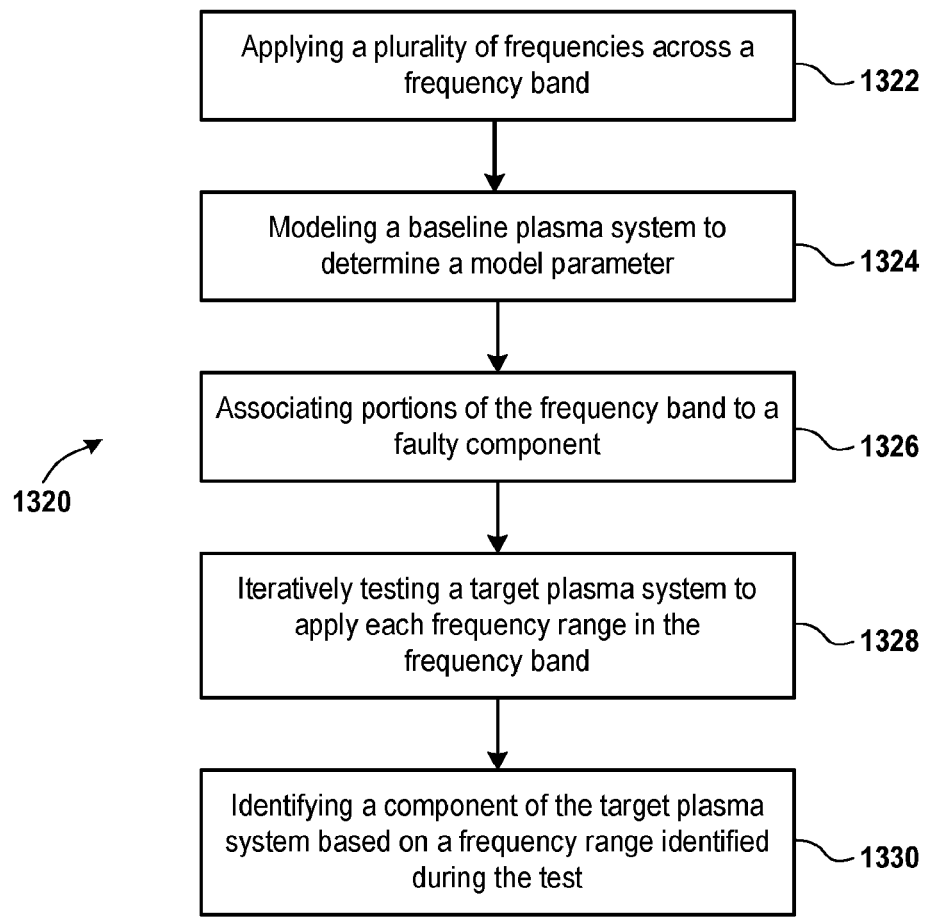
FIG. 13B is a flowchart of a method for determining frequencies of faulty components of the plasma tool of FIG.

FIG. 13B is a flowchart of an embodiment of a method 1320 for determining frequencies of faulty components of the plasma tool 100 (FIG. 1) and for identifying a faulty component of the plasma tool 100. The method 1320 is executed by the system 1300 (FIG. 13A).

In an operation 1322 of the method 1320, the controller 306 of the FGMD 302 (FIG. 3A) sends a signal to the RF power supply 310 (FIG. 3A) to supply RF signals having a frequency band, e.g., the frequency ranges 1 thru n, etc. to a portion, e.g., the portion 104, 106, 108, or 110, etc., to which the FGMD 302 is connected. The FGMD 302 is connected to the portion after disconnecting the x, y, and z MHz RF generators (FIG. 3A) from the portion. It should be noted that in some embodiments, the frequency ranges 1 thru n have frequencies that allow the portion to operate in a state, e.g., a steady state, etc. For example, the frequencies of the frequency ranges 1 thru n allow the portion to operate between R1 MHz and R2 MHz (FIGS. 9A and 9B) or between O1 and O2 (FIG. 9C) or between L1 and L2 (FIGS. 10A and 10B) or between L3 and L4 (FIGS. 12A and 12B), etc. The RF power supply 310 applies the RF signals having the frequency band to the portion of the plasma tool 100. It should be noted that before the RF signals are applied in the operation 1322, the user makes one or more components of the plasma tool 100 faulty. For example, the user disconnects the C-shroud 424 (FIG. 4) from ground and/or displaces the spacer 568A (FIG. 5I), and/or displaces the upper electrode 420 (FIG. 4), and/or increases a gap between the upper electrode 420 and the chuck 426 (FIG. 4), etc. The user provides to the processor 314 (FIG. 3A) of the host system 102 (FIG. 3A) one or more names, e.g., upper electrode, lower electrode, RF transmission line, RF rod of the RF transmission line, chuck, C-shroud, spacer, gap, etc., of the one or more components that are made faulty. The one or more names of the one or more components are provided via an input device, e.g., a mouse, a keyboard, a keypad, a touchpad, etc., of the host system 102 for storage in the memory device 316 (FIG. 3A) of the host system 102.

When the RF signals are sent to the portion, the portion modifies the RF signals to generate modified RF signals. The sensor 312 senses the modified RF signals to generate values of the parameter. The values of the parameter are stored in the memory device 308 (FIG. 3A) of the FGMD 302. The values of the parameter are accessed by the controller 306 from the memory device 308 and sent via the communication module of the FGMD 302 and the communication module of the host system 102 to the processor 314, which stores the values in the memory device 316 of the host system 102.

In an operation 1324 of the method 1320, the processor 314 accesses the values of the parameter from the memory device 316 and generates a model of the portion of a baseline plasma system, e.g., the plasma tool 100 in which a component is made faulty by the user, etc., to determine an error in a model parameter, e.g., the parameter, etc., of the baseline plasma system. For example, the processor 314 generates a correspondence, e.g., a plot, a mapping, a relationship, a link, etc., between the model parameter that has an error and the frequencies of the RF signals that are generated by the RF power supply 310 (FIG. 3A) of the FGMD 302, and stores the correspondence in the memory device 316 of the host system 102. To further illustrate, the processor 314 creates a correspondence between values of the model parameter that includes an error in the model parameter and the frequency range 1. As another illustration, the processor 314 creates a correspondence between values of the model parameter that includes an error in the model parameter and the frequency range 2. The determination of an error in the model parameter is similar to that of the operation 612 (FIG. 6B) or the operation 726 (FIG. 7B).

In an operation 1326 of the method 1320, the processor 314 associates portions, e.g., the frequency ranges 1 thru n, etc., of the frequency band with one or more components of the plasma tool 100 that are made faulty before application of the frequencies in the operation 1322. For example, the processor 314 generates a correspondence, e.g., a plot, a mapping, a relationship, a link, etc., between the frequency range 1 and the name of the upper electrode 420 (FIG. 4) that is made faulty and that results in an error in the model parameter in the frequency range 1. As another example, the processor 314 generates a correspondence between the frequency range n and the name of the C-shroud 424 (FIG. 4) that is made faulty and that generates an error in the model parameter in the frequency range n. As yet another example, the processor 314 generates a correspondence between the frequency range n and the name of the upper electrode 420 and the chuck 426 that are made faulty and that generate an error in the model parameter in the frequency range n.

The operations 1322, 1324, and 1326 are repeated under control of the processor 314 until correspondences between names of components that are made faulty by the user and one or more of the frequency ranges 1 thru n is determined.

The operation 1328 of the method 1320 is performed after an amount of time has passed after performance of the operations 1322, 1324, and 1326. For example, the operation 1328 is performed after the plasma tool 100 is used for a number of times to process a wafer. In some embodiments, the operation 1328 of the method is performed immediately after performance of the operations 1322, 1324, and 1326 without using the plasma tool 100 for processing a wafer.

During the operation 1328, a target plasma system, e.g., the plasma tool 100, another plasma tool, etc., is iteratively tested to apply each frequency range 1 thru n in the frequency band. For example, the controller 306 of the FGMD 302 commands the RF power supply 310 to supply RF signals having frequencies in the frequency range 1, then commands the RF power supply 310 to supply RF signals having frequencies in the frequency range 2, and so on until the frequency range n is applied. In some embodiments, commands to supply the RF signals having frequencies in the frequency ranges 1 thru n are received from the processor 314 of the host system 102 by the controller 306 of the FGMD 302 via the communication modules of the host system 102 and the FGMD 302. When the RF signals for the frequency ranges 1 thru n are applied to the portion of the plasma tool 100, modified RF signals are generated by the portion as described above.

The modified RF signals are sensed by the sensor 312 of the FGMD 302 to calculate the parameter. The sensor 312 provides the parameter that is calculated to the controller 306 for storage in the memory device 308 of the FGMD 302. The controller 306 accesses the parameter from the memory device 308 and provides the parameter via the communication modules of the FGMD 302 and the host system 102 to the processor 314 for storage in the memory device 316 of the host system 102. The processor 314 determines whether there is an error in the parameter for each frequency range 1 thru n based on a comparison with the error that is determined in the operation 1324. For example, the processor 314 determines that there is an error in the parameter in the frequency range n when it is determined by the processor 314 that a value of the parameter determined during the operation 1328 is within a pre-determined range of a value of the parameter that has an error and that is determined during the operation 1324.

Upon determining that the error has occurred for the frequency range n, an operation 1330 of the method 1320 is performed by the processor 314. In the operation 1330, the processor 314 identifies one or more components that create an error in the parameter for the frequency range n. For example, the processor 314 identifies the name of the upper electrode 420 that created the error by determining that the frequency range n in which an error in the parameter occurs corresponds to the name of the upper electrode 420. As another example, the processor 314 identifies the names of the upper electrode 420 and the chuck 426 that created the error by determining that the frequency range n in which an error in the parameter occurs corresponds to the names of the upper electrode 420 and the chuck 426. The processor 314 repeats the operation 1330 until all components that create errors in the parameter in the other frequency ranges, e.g., frequency range 1, frequency range 2, and so on until frequency range (n−1), etc., are identified.

It should be noted that in one embodiment, frequencies between O1 and O2 (FIG. 9C) is an example of any of the frequency ranges 1 thru n (FIG. 3A). In an embodiment, frequencies between P1 and P2 (FIG. 10A) is an example of any of the frequency ranges 1 thru n. In one embodiment, frequencies between Q1 and Q2 (FIG. 12A) is an example of any of the frequency ranges 1 thru n.

It should further be noted that although the above-described embodiments relate to providing one or more RF signals to the lower electrode of the chuck 426 of the plasma reactor 402, and grounding an upper electrode 420 of the plasma reactor 402, in several embodiments, the one or more RF signals are provided to the upper electrode 420 while the lower electrode is grounded.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining operational parameters for carrying out a particular process on or for a semiconductor wafer or to a system. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc. For example, one or more of the x MHz RF generator, the y MHz RF generator, and the z MHz RF generator are coupled to an inductor within the ICP plasma chamber.

As noted above, depending on the process step or steps to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method comprising:
    applying, by a radio frequency (RF) power supply of a frequency generator and measurement device (FGMD), a plurality of RF signals having a plurality of frequency ranges of operational states of a baseline plasma system;
    receiving measurements of a model parameter upon applying the plurality of frequency ranges;
    determining a plurality of errors in the measurements of the model parameter of the baseline plasma system, wherein the plurality of errors occur as a result of a plurality of faulty components of the baseline plasma system;
    associating each of the plurality of frequency ranges corresponding to the plurality of errors in the model parameter to a corresponding one of the plurality of faulty components of the baseline plasma system;
    iteratively testing a target plasma system with the RF power supply of the FGMD to apply each of the plurality of frequency ranges to identify one of the plurality of frequency ranges for which one of the plurality of errors is detected; and
    identifying one of a plurality of components having a fault in the target plasma system based on the one of the plurality of frequency ranges identified during the iterative test.

2. The method of claim 1, wherein said applying the plurality of RF signals comprises supplying the plurality of RF signals having the plurality of frequency ranges from the FGMD to the baseline plasma system when the baseline plasma system is not coupled to a plurality of RF generators.

3. The method of claim 1, wherein the baseline plasma system is configured to have the plurality of faulty components before said applying the plurality RF signals to the baseline plasma system.

4. The method of claim 1, wherein any one of the plurality of frequency ranges is exclusive of another one of the plurality of frequency ranges.

5. The method of claim 1, wherein the operational states include a steady state in which the baseline plasma system operates.

6. The method of claim 1, wherein the model parameter is a parameter, the method further comprising storing a correspondence between the plurality of frequency ranges and the plurality of errors in the parameter.

7. The method of claim 6, wherein said associating each of the plurality of frequency ranges to the corresponding one of the plurality of faulty components comprises establishing a correspondence between a corresponding one of a plurality of identifiers of the corresponding one of the plurality of faulty components and said each of the frequency ranges for which a corresponding one of the plurality of errors is determined to occur, wherein the plurality of faulty components exist in the baseline plasma system before said applying the plurality of RF signals.

8. The method of claim 1, wherein the target plasma system is decoupled from a plurality of RF generators to be coupled to the FGMD, wherein said iteratively testing the target plasma system comprises:
    supplying from the FGMD a first plurality of RF signals having the one of the plurality of frequency ranges to the target plasma system;
    supplying from the FGMD a second plurality of RF signals having a second one of the plurality of frequency ranges to the target plasma system;
    determining that a parameter is outside a pre-determined range when the first plurality of RF signals are supplied to the target plasma system to identify the one of the plurality of frequency ranges.

9. The method of claim 8, wherein said determining that the parameter is outside the pre-determined range comprises:
    determining that a phase of the parameter is outside a pre-determined phase range; or
    determining that an amplitude of the parameter is outside a pre-determined amplitude range.

10. The method of claim 8, wherein the parameter is complex impedance or complex voltage and current or complex delivered power.

11. The method of claim 1, wherein the FGMD is coupled via a connector and an RF transmission line to an electrode of a plasma chamber, wherein the RF transmission line includes a transmission line portion and a cylinder portion, wherein the cylinder portion is coupled to the transmission line portion via an RF strap.

12. The method of claim 1, wherein the model parameter is complex impedance or complex voltage and current or complex delivered power.

13. The method of claim 1, further comprising storing a correspondence between the plurality of frequency ranges and the plurality of errors in the parameter,
    wherein said associating each of the plurality of frequency ranges to the corresponding one of the plurality of faulty components comprises establishing a correspondence between a corresponding one of a plurality of identifiers of the corresponding one of the plurality of faulty components and said each of the plurality of frequency ranges for which a corresponding one of the plurality of errors is determined to occur,
    wherein said identifying the one of the plurality of components having the fault in the target plasma system comprises determining the corresponding one of the plurality of identifiers of the one of the plurality of faulty components to determine that the one of the plurality of components of the target baseline system is creating the corresponding one of the plurality of errors.

* * * * *